(12) United States Patent
Yen et al.

(10) Patent No.: US 10,867,862 B2
(45) Date of Patent: Dec. 15, 2020

(54) SEMICONDUCTOR METHOD AND DEVICE

(71) Applicant: Taiwan Semiconductor Manufacturing Company, Ltd., Hsinchu (TW)

(72) Inventors: Cheng-Hsiung Yen, Hsinchu (TW); Ta-Chun Ma, New Taipei (TW); Chien-Chang Su, Kaohsiung (TW); Jung-Jen Chen, Hsinchu (TW); Pei-Ren Jeng, Chu-Bei (TW); Chii-Horng Li, Zhubei (TW); Kei-Wei Chen, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/443,284

(22) Filed: Jun. 17, 2019

(65) Prior Publication Data
US 2020/0075729 A1 Mar. 5, 2020

Related U.S. Application Data

(60) Provisional application No. 62/726,000, filed on Aug. 31, 2018.

(51) Int. Cl.
| | |
|---|---|
| *H01L 21/8234* | (2006.01) |
| *H01L 21/8238* | (2006.01) |
| *H01L 29/06* | (2006.01) |
| *H01L 29/165* | (2006.01) |
| *H01L 29/10* | (2006.01) |
| *H01L 21/02* | (2006.01) |
| *H01L 21/324* | (2006.01) |
| *H01L 27/092* | (2006.01) |

(52) U.S. Cl.
CPC .. *H01L 21/823431* (2013.01); *H01L 21/0206* (2013.01); *H01L 21/0217* (2013.01); *H01L 21/02068* (2013.01); *H01L 21/02164* (2013.01); *H01L 21/02238* (2013.01); *H01L 21/02532* (2013.01); *H01L 21/324* (2013.01); *H01L 21/823807* (2013.01); *H01L 21/823821* (2013.01); *H01L 21/823878* (2013.01); *H01L 27/0924* (2013.01); *H01L 29/0653* (2013.01); *H01L 29/1037* (2013.01); *H01L 29/165* (2013.01)

(58) Field of Classification Search
CPC .......... H01L 21/8232; H01L 29/1025
See application file for complete search history.

(56) References Cited

U.S. PATENT DOCUMENTS

| | | |
|---|---|---|
| 9,093,530 B2 | 7/2015 | Huang et al. |
| 9,171,929 B2 | 10/2015 | Lee et al. |

(Continued)

*Primary Examiner* — Cheung Lee
(74) *Attorney, Agent, or Firm* — Slater Matsil, LLP

(57) ABSTRACT

A device is manufactured by providing a semiconductor fin protruding from a major surface of a silicon substrate comprising silicon. A liner and a shallow trench isolation (STI) region are formed adjacent the semiconductor fin. A silicon cap is deposited over the semiconductor fin. The resulting cap consists of crystalline silicon in the portion over the semiconductor fin and consists of amorphous silicon in the portions over the liner and STI region. An HCl etch bake process is performed to remove the portions of amorphous silicon over the liner and the STI region.

20 Claims, 38 Drawing Sheets

(56) References Cited

U.S. PATENT DOCUMENTS

| | | | |
|---|---|---|---|
| 9,214,555 B2 | 12/2015 | Oxland et al. | |
| 9,236,267 B2 | 1/2016 | De et al. | |
| 9,520,482 B1 | 12/2016 | Chang et al. | |
| 9,548,303 B2 | 1/2017 | Lee et al. | |
| 9,564,489 B2 | 2/2017 | Yeo et al. | |
| 9,576,814 B2 | 2/2017 | Wu et al. | |
| 9,601,342 B2 | 3/2017 | Lee et al. | |
| 9,608,116 B2 | 3/2017 | Ching et al. | |
| 2016/0379831 A1* | 12/2016 | Yeo | H01L 29/78684 438/591 |
| 2019/0295844 A1* | 9/2019 | Lee | H01L 27/1211 |

\* cited by examiner

SEMICONDUCTOR METHOD AND DEVICE

CROSS-REFERENCE TO RELATED APPLICATIONS

This application claims the benefit of U.S. Provisional Application No. 62/726,000, filed on Aug. 31, 2018, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

FinFETs are increasingly employed in the manufacture of integrated circuits, owing to the small size and high performance of the FinFET transistor. Fully strained channels further improve FinFET performance, but fully strained channel architectures creates their own shortcomings to be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
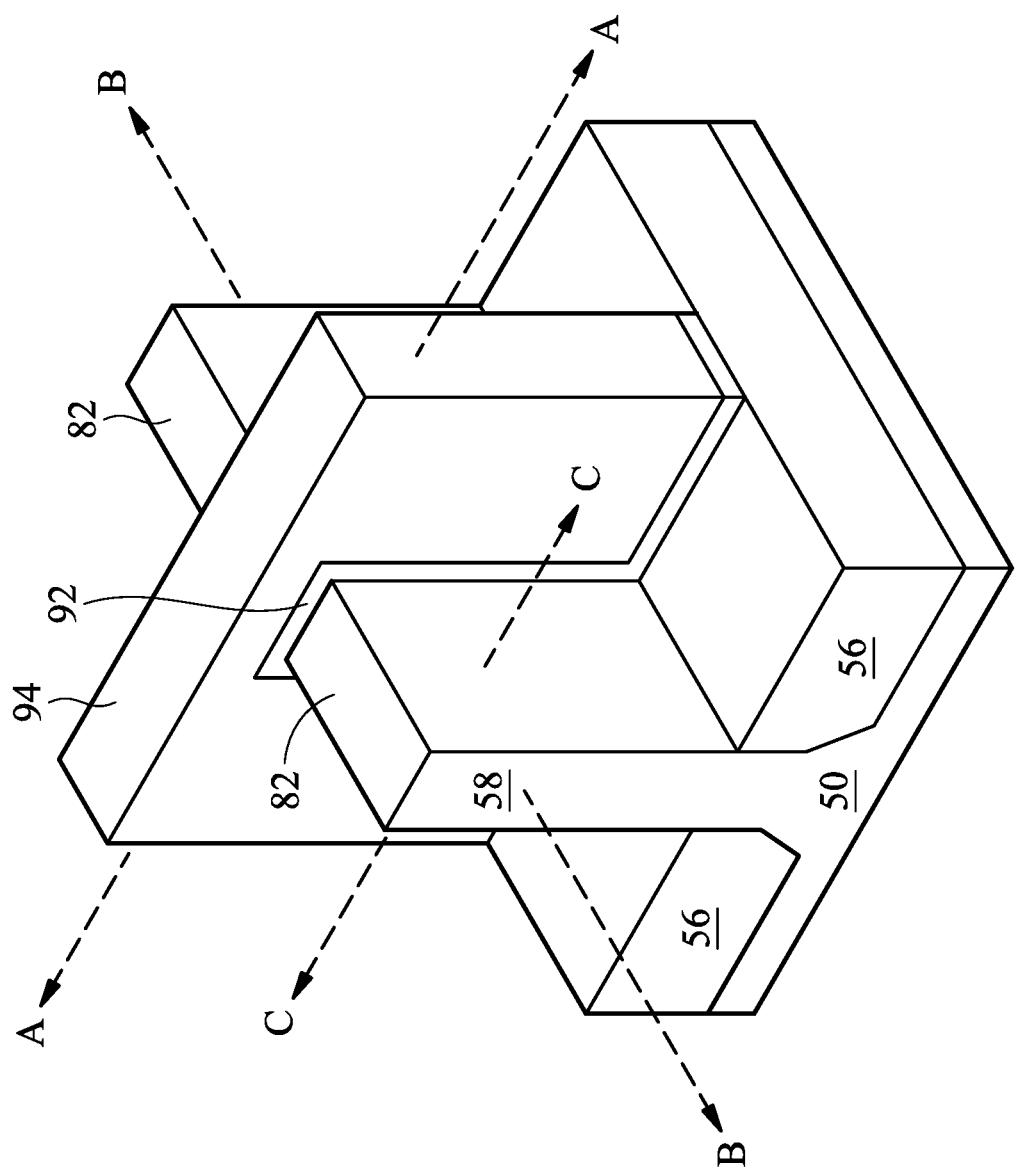
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Advantageous features of one or more embodiments disclosed herein includes a process for a selective free process of low temperature Si epitaxial growth. Improved device performance can result. Other advantageous features may include the ability to grow a thicker Si cap layer on a SiGe fin without selective loss on the surrounding shallow trench isolation (STI) region. Enhanced hole mobility can thus be achieved without necessarily increasing interface trapping density.

Various embodiments provide processes for forming improved semiconductor fins. For example, a silicon cap layer may be formed over a semiconductor fin formed at least partially of silicon germanium. The semiconductor fin may be on an N-well and may include a portion of the N-well. The cap layer may be formed using a low-temperature process such that outdiffusion of germanium from the semiconductor fin is limited. Specifically, the low-temperature process may include a pre-clean process, a sublimation process, a deposition process, and a cooling process performed in situ in a furnace.

The resulting p-type semiconductor fin may have reduced wiggle effect (e.g., less bending or warping along the length of the p-type semiconductor fin), better line-edge roughness, improved drain-induced barrier lowering (DIBL), low channel resistance, and reduced variation in threshold voltage. Furthermore, the semiconductor fin may be formed without small wings (e.g., triangular protrusions extending from sidewalls of the semiconductor fin) being formed. As such, semiconductor devices including semiconductor fins formed by these processes may have improved device performance.

FIG. 1 illustrates an example of a FinFET in a three-dimensional view for reference, in accordance with some embodiments. The FinFET comprises a fin 58 on a substrate 50 (e.g., a semiconductor substrate). Isolation regions 56 are disposed in the substrate 50, and the fin 58 protrudes above and from between neighboring isolation regions 56. Although the isolation regions 56 are described and illustrated as being separate from the substrate 50, as used herein the term "substrate" may be used to refer to just the semiconductor substrate or a semiconductor substrate inclusive of the isolation regions 56. A gate dielectric layer 92 is along sidewalls and over a top surface of the fin 58, and a gate electrode 94 is over the gate dielectric layer 92. Source/drain regions 82 are disposed in opposite sides of the fin 58 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to the cross-section A-A and is along a longitudinal axis of the fin 58 and in a direction of, for example, a current flow between the source/drain regions 82 of the FinFET. Cross-section C-C is parallel to the cross-section A-A and extends through one of the source/drain regions 82 of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2 through 24B are cross-sectional views of intermediate stages in the manufacturing of FinFETs, in accordance with some embodiments. FIGS. 2 through 12 illustrate reference cross-section A-A illustrated in FIG. 1, except for illustrating multiple fins/FinFETs. In FIGS. 15A through 24B, figures ending with an "A" designation are illustrated along reference cross-section A-A illustrated in FIG. 1, except for illustrating multiple fins/FinFETs, and figures ending with a "B" designation are illustrated along a similar cross-section B-B illustrated in FIG. 1. FIGS. 18C and 18D are illustrated along reference cross-section C-C illustrated in FIG. 1.

Figure 2:
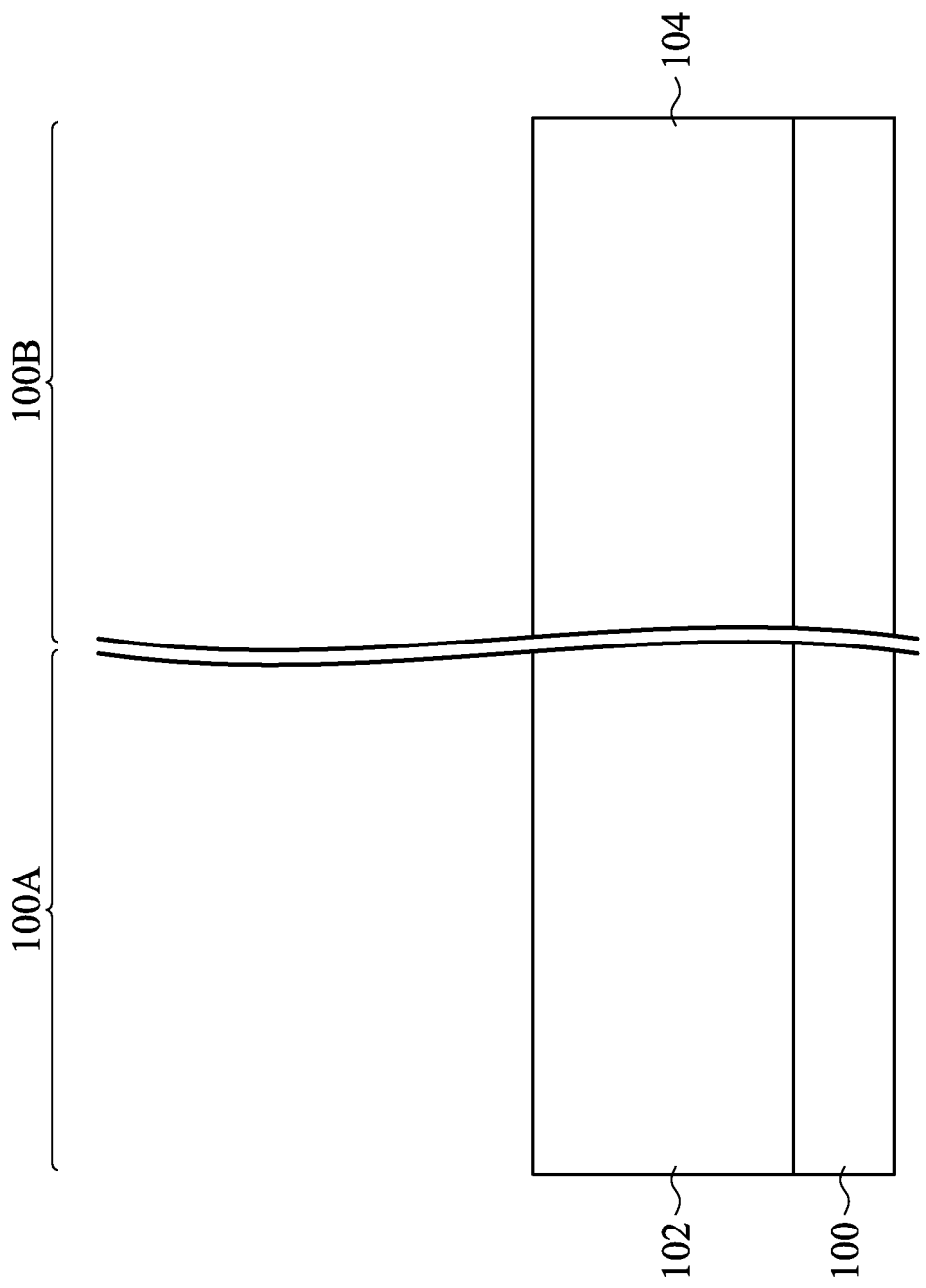
FIG. 2 illustrates a cross-sectional view of an N-well and a P-well over a substrate, in accordance with some embodiments.

In FIG. 2, a substrate 100 having an n-well region 102 and a p-well region 104 formed therein is provided. The substrate 100 may be a semiconductor substrate, such as a bulk semiconductor, a semiconductor-on-insulator (SOI) substrate, or the like, which may be doped (e.g., with a p-type dopant or an n-type dopant) or undoped. The substrate 100 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, which is typically a silicon or glass substrate. Other substrates, such as a multi-layered or gradient substrate may also be used.

The substrate 100 has a first region 100A and a second region 100B. The first region 100A may be for forming p-type devices, such as PMOS transistors, e.g., p-type FinFETs. The second region 100B may be for forming n-type devices, such as NMOS transistors, e.g., n-type FinFETs. The first region 100A may be physically separated from the second region 100B by a divider, and any number of device features (e.g., other active devices, doped regions, isolation structures, etc.) may be disposed between the first region 100A and the second region 100B.

The n-well region 102 may be formed in the substrate 100 by covering the p-well region 104 with a mask (such as a photoresist, an oxide, or the like) and performing an ion implantation process on the n-well region 102. N-type dopants, such as arsenic ions, may be implanted into the n-well region 102. The p-well region 104 may be formed in the substrate 100 by covering the n-well region 102 with a mask (such as a photoresist, an oxide, or the like) and performing an ion implantation process on the p-well region 104. P-type dopants, such as boron ions, may be implanted into the p-well region 104. In some embodiments, the n-well region 102 may comprise n-type doped silicon and the p-well region 104 may comprise p-type doped silicon.

Figure 3:
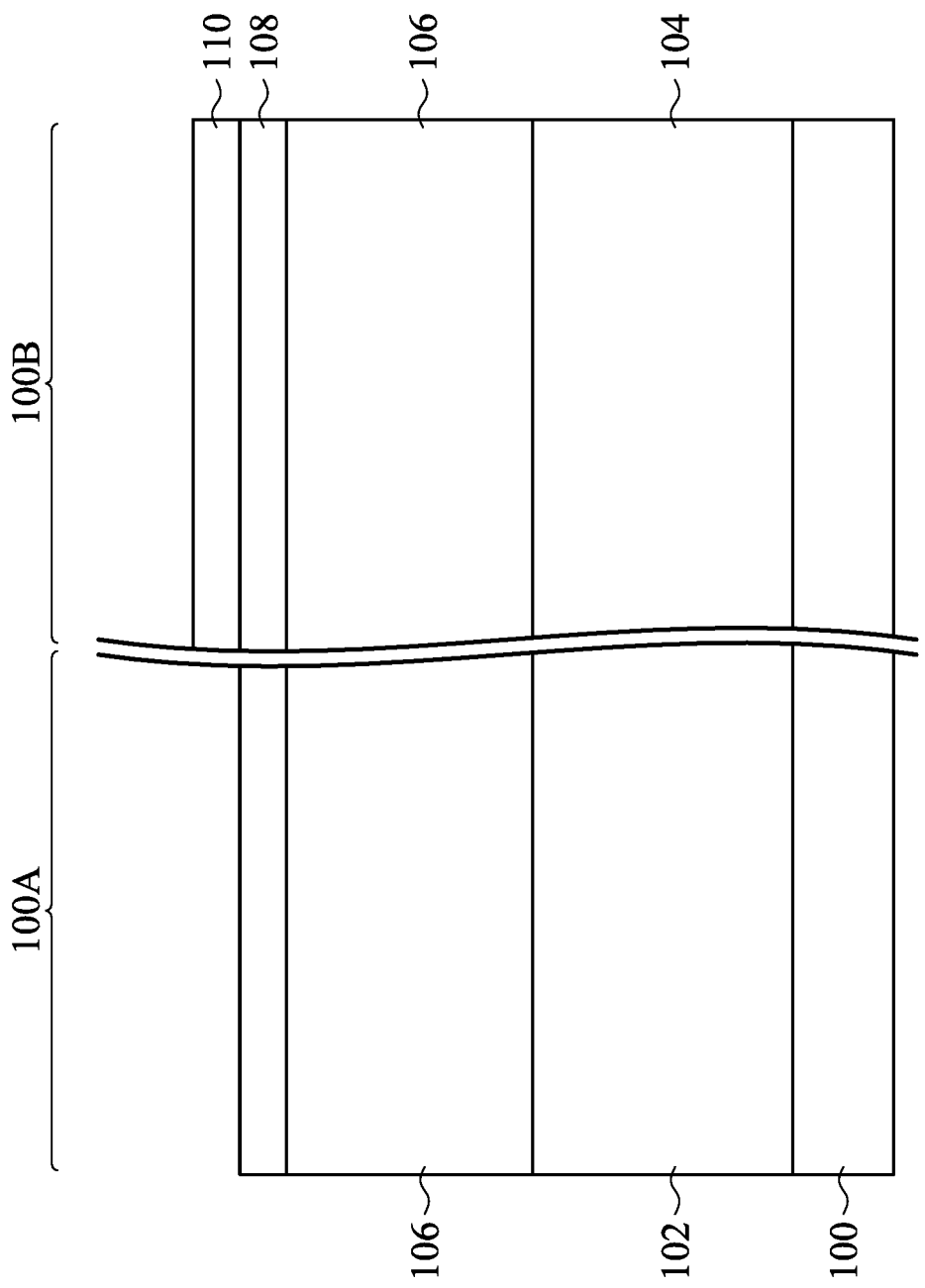
FIG. 3 illustrates a cross-sectional view of a formation of a first epitaxial layer, a mask layer, and a patterned photoresist, in accordance with some embodiments.

In FIG. 3, a first epitaxial layer 106 is formed over the n-well region 102 and the p-well region 104, a mask layer 108 is formed over the first epitaxial layer 106, and a patterned photoresist 110 is formed on the mask layer 108. The first epitaxial layer 106 may be a channel in a subsequently formed NMOS device and may be used to reduce dislocation defects in a subsequently formed second epitaxial layer 114. The first epitaxial layer 106 may be formed by a process such as epitaxial growth or the like. The first epitaxial layer 106 may comprise a material such as silicon or the like. The first epitaxial layer 106 may have a lattice constant similar to or the same as the lattice constants of the n-well region 102 and the p-well region 104. As explained in greater detail below, the first epitaxial layer 106 will be patterned to form a fin in the second region 100B (e.g., for NMOS devices) and will be used as a seed layer to form another epitaxial layer in the first region 100A (e.g., for PMOS devices). In some embodiments, the first epitaxial layer 106 has a thickness of between about 1 Å and about 300 Å.

The mask layer 108 may be formed by a process such as chemical vapor deposition (CVD), atomic layer deposition (ALD), or the like. The mask layer 108 may comprise a material such as silicon dioxide, silicon nitride, or the like. The patterned photoresist 110 may be deposited using a spin-on technique or the like and patterned by exposing the photoresist material to a patterned energy source (e.g., a patterned light source, an electron beam (e-beam) source, or the like) and exposing the patterned photoresist material to a developer solution. The developer solution may remove a portion of the photoresist material such that at least a portion of the mask layer 108 is exposed. As illustrated in FIG. 3, the patterned photoresist 110 may be patterned such that the patterned photoresist 110 extends over the p-well region 104 without extending over the n-well region 102. However, in various other embodiments, the patterned photoresist 110 may overlap at least a portion of the n-well region 102 or may not completely cover the p-well region 104.

Figure 4:
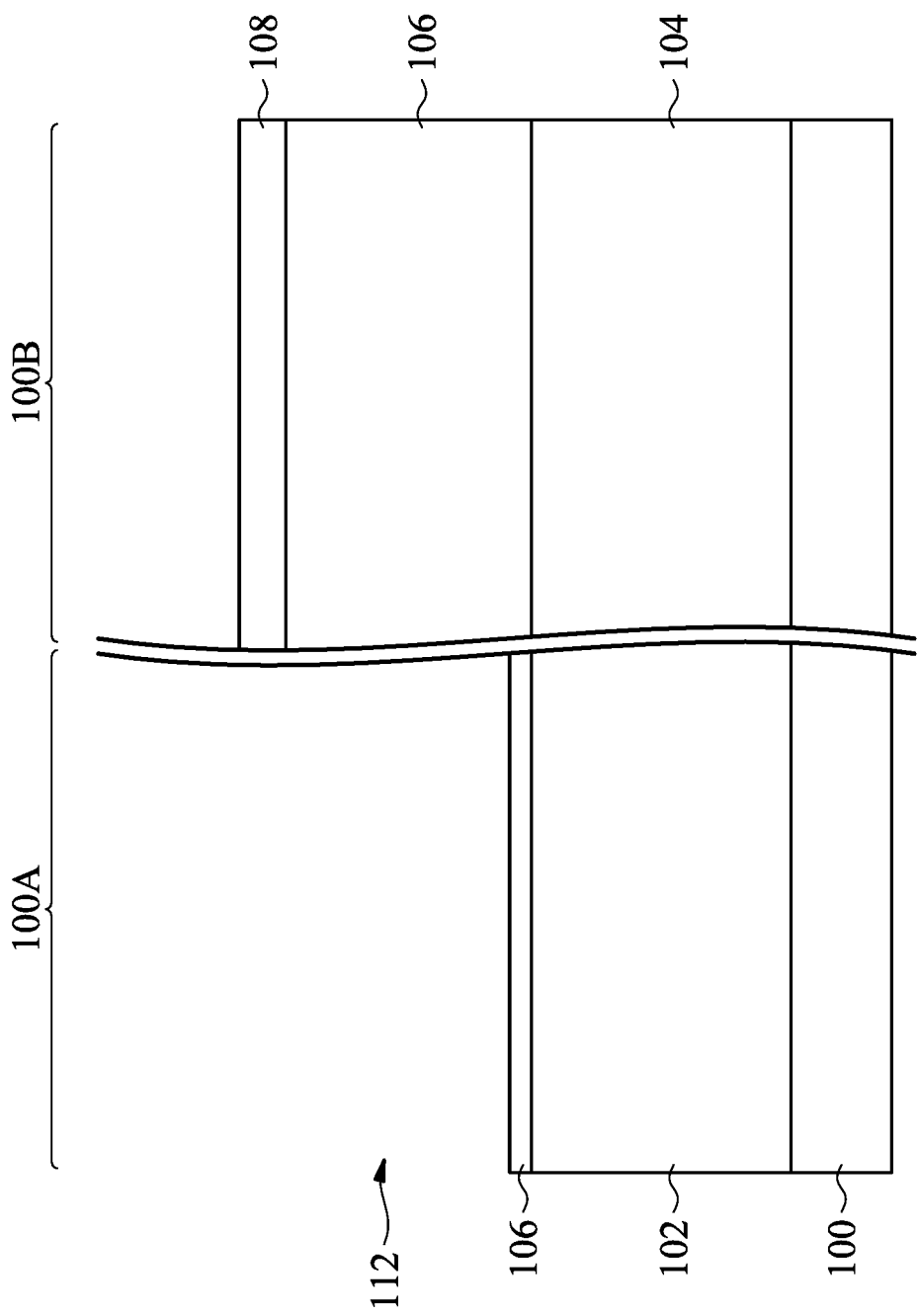
FIG. 4 illustrates a cross-sectional view of a formation of a first opening, in accordance with some embodiments.

In FIG. 4, the mask layer 108 is etched using the patterned photoresist 110 as a mask and the first epitaxial layer 106 is etched using the mask layer 108 as a mask to form a first opening 112. The mask layer 108 and the first epitaxial layer 106 may be etched by suitable etch processes, such as anisotropic etch processes. In some embodiments, the mask layer 108 and the first epitaxial layer 106 may be etched by dry etch processes such as reactive-ion etching (RIE), neutral-beam etching (NBE), combinations thereof, or the like. After the mask layer 108 is etched, the patterned photoresist 110 may be removed using suitable photoresist stripping techniques, such as chemical solvent cleaning, plasma ashing, dry stripping and/or the like. The patterned photoresist 110 may be removed before or after etching the first epitaxial layer 106. As illustrated in FIG. 4, the first opening 112 may be formed over the n-well region 102, without extending over the p-well region 104. However, in some embodiments, the first opening 112 may extend over at least a portion of the p-well region 104. As illustrated in FIG. 4, at least a portion of the first epitaxial layer 106 may remain below the first opening 112. The portion of the first epitaxial layer 106 remaining over the n-well region 102 may be used to grow a second epitaxial layer 114, discussed below in reference to FIG. 5. In some embodiments, the portion of the first epitaxial layer 106 remaining may have a thickness of between about 1 Å and about 300 Å after etching the first opening 112. In some embodiments, a depth of the first opening 112 is between about 100 Å and about 5,000 Å.

Figure 5:
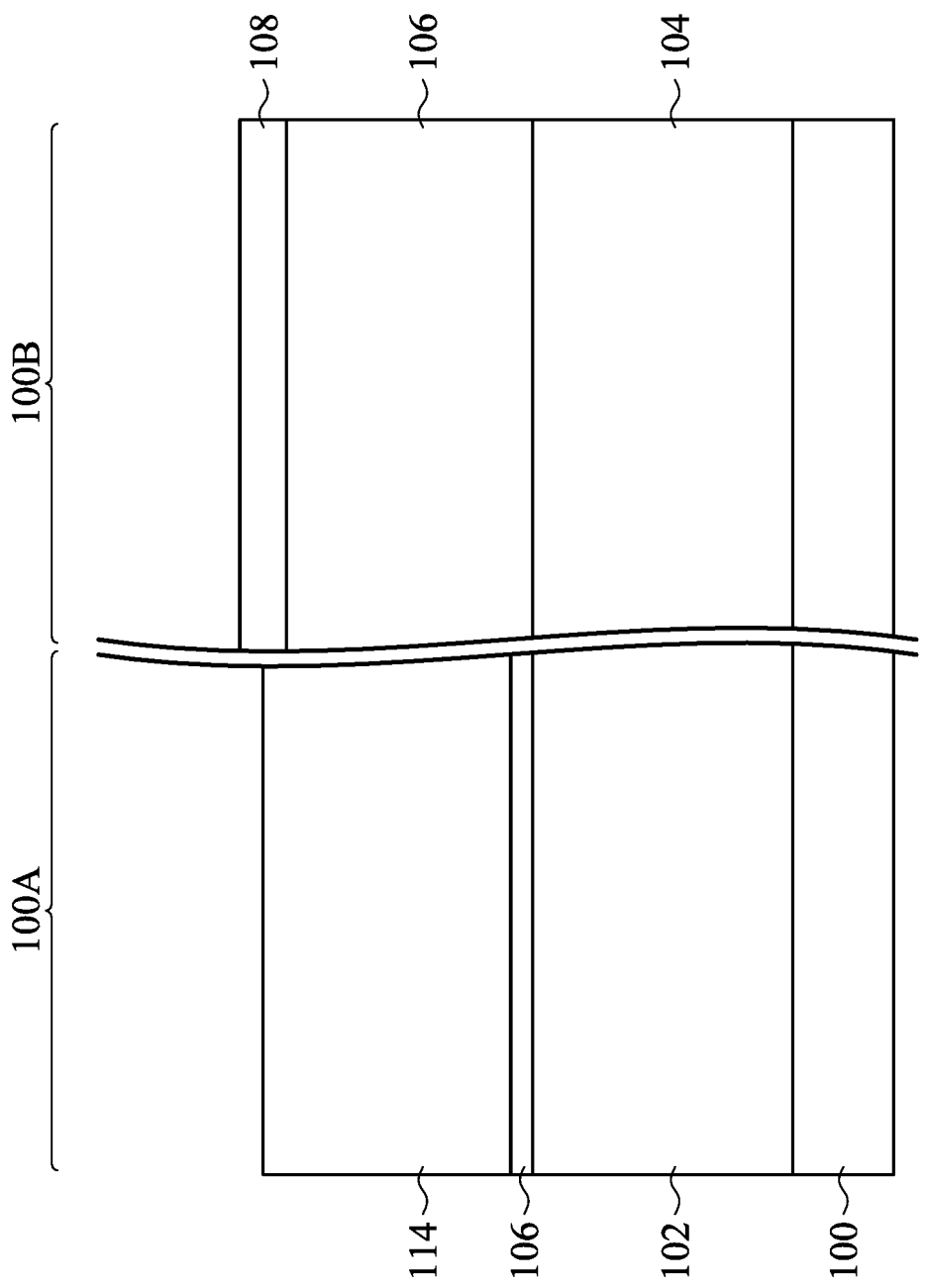
FIG. 5 illustrates a cross-sectional view of a formation of a second epitaxial layer, in accordance with some embodiments.

In FIG. 5, a second epitaxial layer 114 is formed in the first opening 112. The second epitaxial layer 114 may be formed by a process such as epitaxial growth or the like. The second epitaxial layer 114 may comprise a material such as silicon germanium (SiGe), or the like. In embodiments in which the first region 100A is a PMOS region, the second epitaxial layer 114 may comprise a material having a greater lattice constant than the lattice constant of the first epitaxial layer 106. For example, in some embodiments, the second epitaxial layer 114 may comprise SiGe. SiGe comprises a lower bandgap than Si, allowing for greater hole mobility for subsequently formed PMOS devices.

As illustrated in FIG. 5, the second epitaxial layer 114 may fill the first opening 112 such that a top surface of the second epitaxial layer 114 is disposed above a top surface of the first epitaxial layer 106. The second epitaxial layer 114 may be formed to a thickness such that a subsequent planarization process of the first epitaxial layer 106 and the second epitaxial layer 104 will create a planar surface. In some embodiments, at least a portion of the second epitaxial layer 114 may extend over the mask layer 108.

Figure 6:
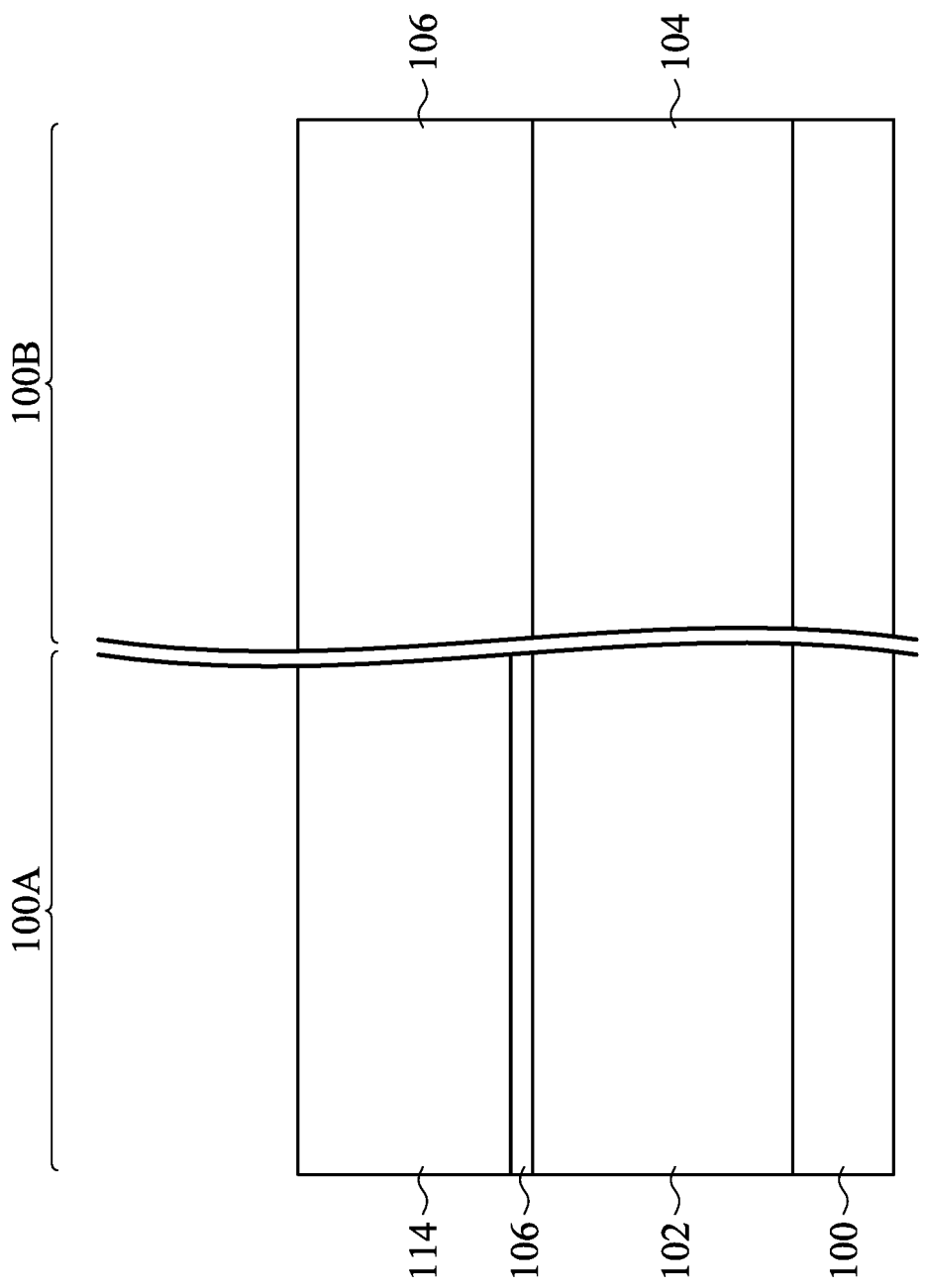
FIG. 6 illustrates a cross-sectional view of a planarization of the first epitaxial layer and the second epitaxial layer, in accordance with some embodiments.

In FIG. 6, the mask layer 108 is removed and a planarization process is performed on the first epitaxial layer 106 and the second epitaxial layer 114. The mask layer 108 may be removed using a suitable etch process, such as a wet etch process (e.g., dilute hydrofluoric (dHF) acid, or the like). The first epitaxial layer 106 and the second epitaxial layer 114 may be planarized by any suitable planarization process, such as a chemical mechanical polish (CMP), an etch-back process, combinations thereof, or the like. As illustrated in FIG. 6, following the planarization process, top surfaces of the first epitaxial layer 106 may be level with top surfaces of the second epitaxial layer 114. In some embodiments, following the planarization process, the second epitaxial layer 114 may have a thickness of between about 100 Å and about 5,000 Å, and the first epitaxial layer 106 in the second region 100B may have a thickness of between about 100 Å and about 50,000 Å.

Figure 7:
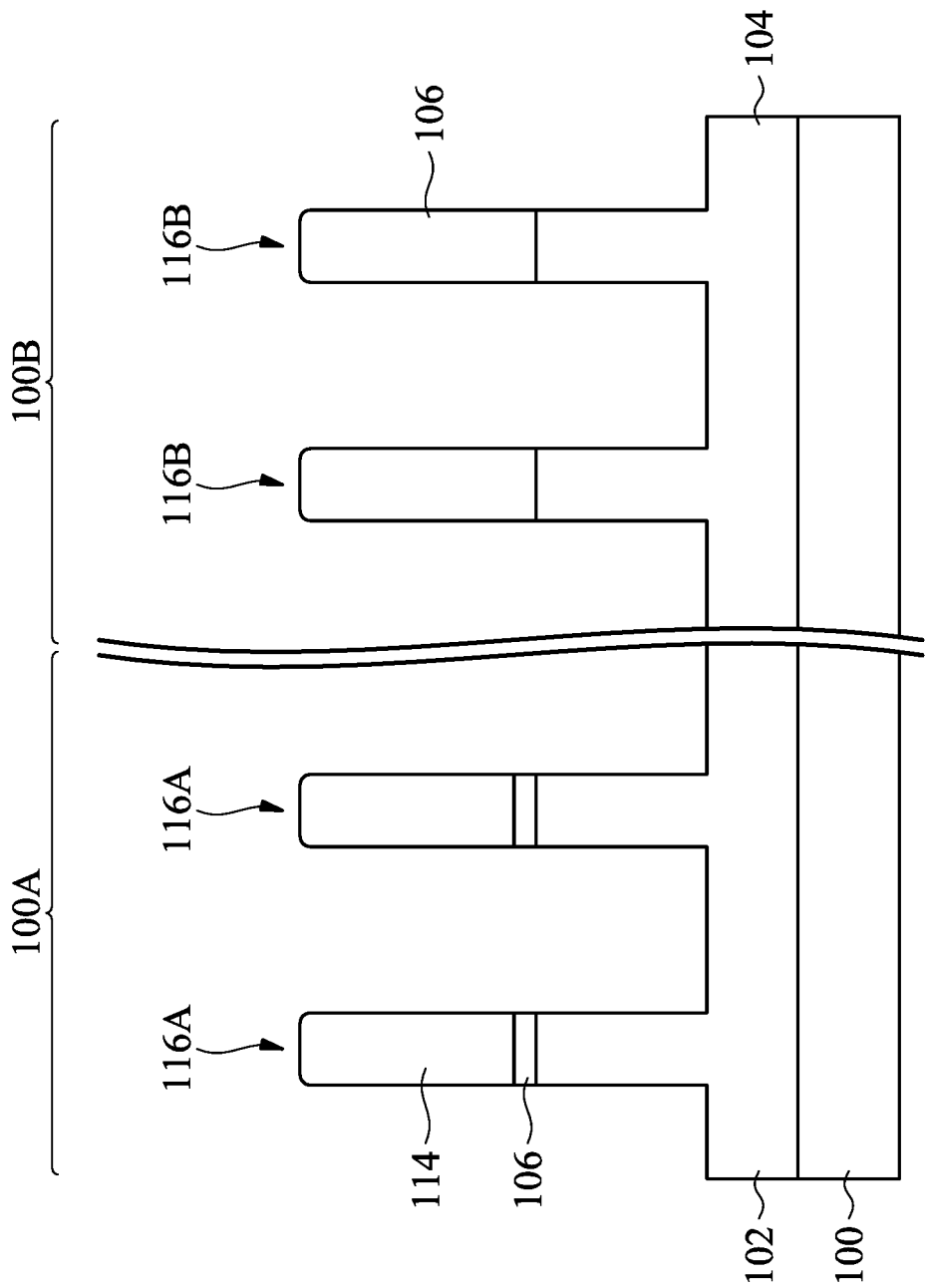
FIG. 7 illustrates a cross-sectional view of a formation of first semiconductor fins and second semiconductor fins, in accordance with some embodiments.

In FIG. 7, the second epitaxial layer 114, the first epitaxial layer 106, the n-well region 102, and the p-well region 104 are etched to form first semiconductor fins 116A in the first region 100A and second semiconductor fins 116B in the second region 100B. In some embodiments, the first semiconductor fins 116A and the second semiconductor fins 116B may be formed by etching trenches in the second epitaxial layer 114, the first epitaxial layer 106, the n-well region 102, and the p-well region 104. The etching may be one or more of any acceptable etch process, such as a reactive ion etch (RIE), a neutral beam etch (NBE), the like, or a combination thereof. The etching may be anisotropic. Although the first semiconductor fins 116A and the second semiconductor fins 116B are illustrated as having rounded corners and linear edges, the first semiconductor fins 116A and the second semiconductor fins 116B may have any other suitable shape, such as having tapered sidewalls. In some embodiments, the first semiconductor fins 116A and the second semiconductor fins 116B may have a height of between about 10 Å and about 5,000 Å.

The first semiconductor fins 116A and the second semiconductor fins 116B may be patterned by any suitable method. For example, the first semiconductor fins 116A and the second semiconductor fins 116B may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. Although a double-patterning or multi-patterning process is not separately illustrated, in one embodiment, the double-patterning or multi-patterning process may include forming a sacrificial layer over a substrate. The sacrificial layer is patterned using a photolithography process. Spacers are formed alongside the sacrificial layer using a self-aligned process. The sacrificial layer is then removed and the remaining spacers are used to pattern first semiconductor fins 116A and second semiconductor fins 116B.

Including the second epitaxial layer 114 formed of, e.g., silicon germanium in the first semiconductor fins 116A in the first region 100A (e.g., the PMOS region) may increase the hole mobility of subsequently formed PMOS transistors. Additionally, because germanium has a smaller bandgap than silicon, including the second epitaxial layer 114 in the first semiconductor fins 116A may yield a higher current in subsequently formed PMOS transistors.

Figure 8:
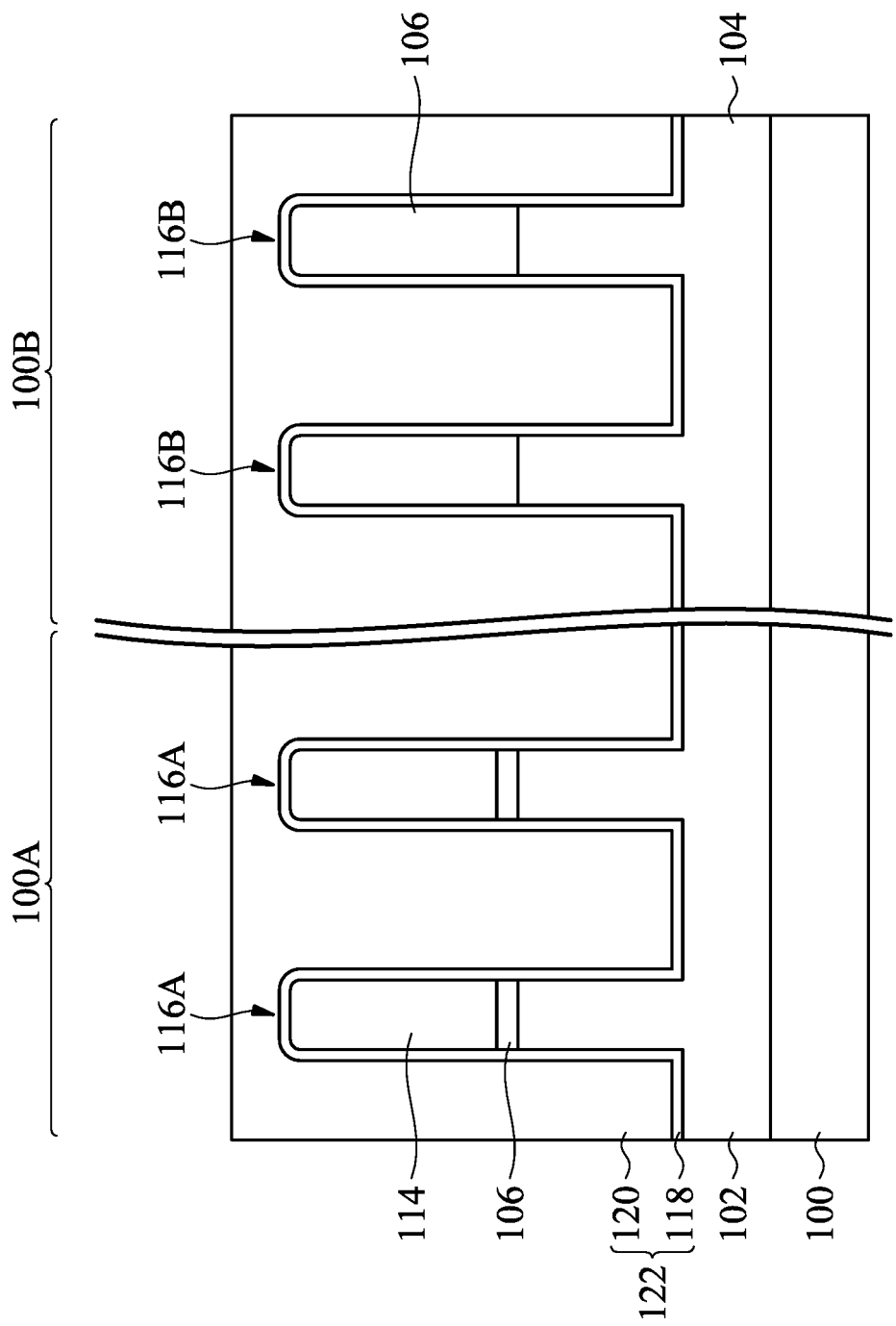
FIG. 8 illustrates a cross-sectional view of a formation of an insulating material, in accordance with some embodiments.

In FIG. 8, an insulation material 122 is formed over the substrate 100, the first semiconductor fins 116A, and the second semiconductor fins 116B, filling openings between the first semiconductor fins 116A and the second semiconductor fins 116B. In some embodiments, the insulation material 122 includes a liner 118 and a dielectric material 120 over the liner 118, as illustrated in FIG. 8. The liner 118 may be formed as a conformal layer, whose horizontal portions and vertical portions have thicknesses close to each other.

In some embodiments, the liner 118 is formed by oxidizing exposed surfaces of the substrate 100, the first semiconductor fins 116A, and the second semiconductor fins 116B in an oxygen-containing environment, for example, through Local Oxidation of Silicon (LOCOS), wherein oxygen ($O_2$) may be included in the respective process gas. In other embodiments, the liner 118 may be formed using, for example, In-Situ Steam Generation (ISSG) with water steam or a combined gas of hydrogen ($H_2$) and oxygen ($O_2$) used to oxidize the exposed surfaces of the substrate 100, the first semiconductor fins 116A, and the second semiconductor fins 116B. The ISSG oxidation may be performed at an elevated temperature. In yet other embodiments, the liner 118 is formed using a deposition technique, such as ALD, CVD, sub-atmospheric chemical vapor deposition (SACVD), the like, or a combination thereof. In some embodiments, the liner 118 may have a thickness of between about 0.2 Å and about 100 Å. In an exemplary embodiment, the liner 118 may have a thickness of between about 1 to 5 nm. In some embodiments, the liner 118 may comprise SiN or $SiO_2$.

The dielectric material 120 is formed to fill remaining portions of the openings between the first semiconductor fins 116A and the second semiconductor fins 116B. The dielectric material 120 may overfill the openings between the first semiconductor fins 116A and the second semiconductor fins 116B, such that a portion of the dielectric material 120 extends above top surfaces of the first semiconductor fins 116A and the second semiconductor fins 116B. In some embodiments, the dielectric material 120 may comprise silicon oxide, silicon carbide, silicon nitride, the like, or a combination thereof, and may be formed using flowable chemical vapor deposition (FCVD), spin-on coating, CVD, ALD, high-density plasma chemical vapor deposition (HDPCVD), low pressure chemical vapor deposition (LPCVD), the like, or a combination thereof. After the dielectric material 120 is deposited, an anneal/curing step may be performed, which may convert the flowable dielectric material 120 into a solid dielectric material. In some embodiments, an interface between the liner 118 and the dielectric material 120 may be distinguishable due to different material properties such as different types of materials and/or different densities.

Figure 9:
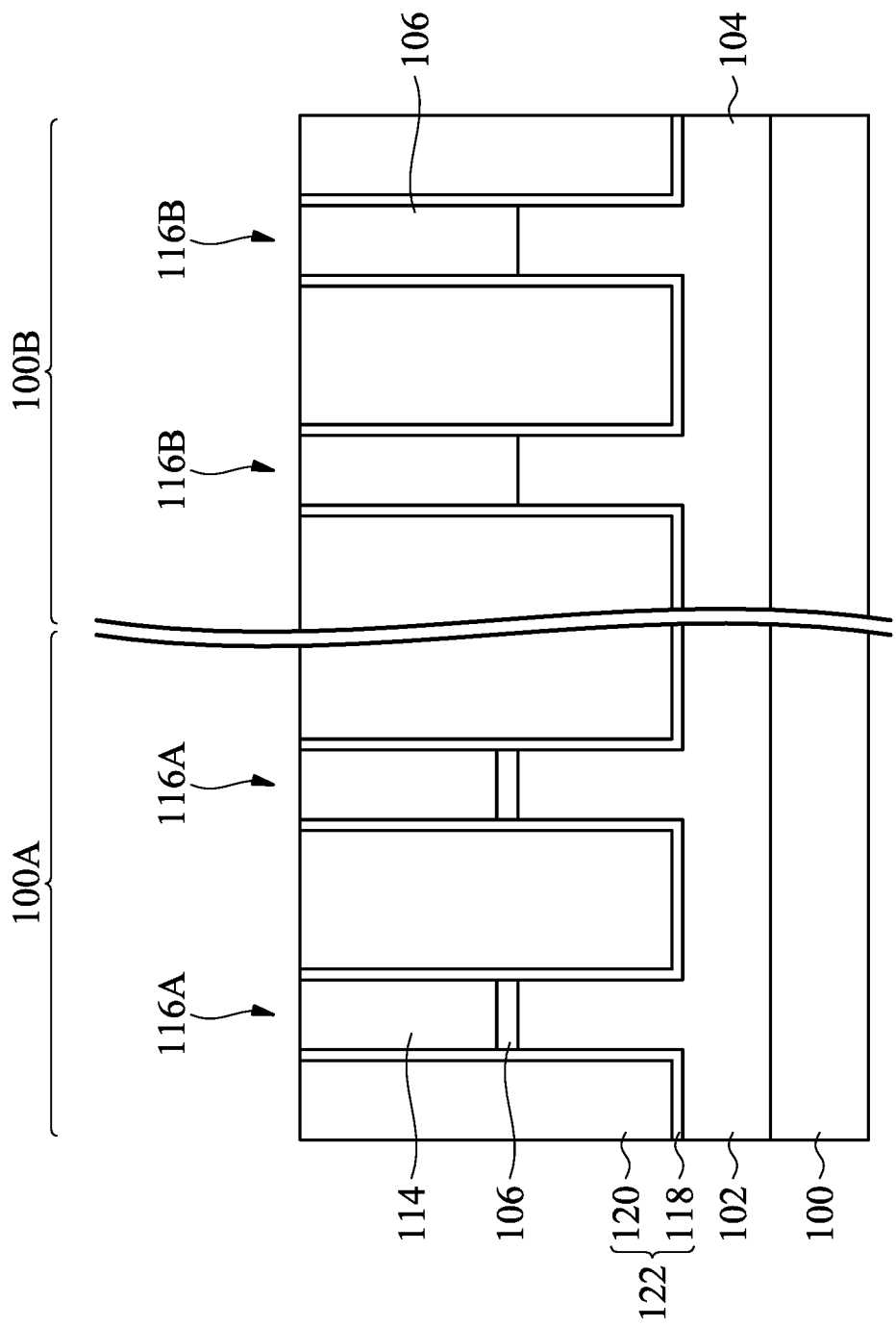
FIG. 9 illustrates a cross-sectional view of a planarization of the insulating material, the first semiconductor fins, and the second semiconductor fins, in accordance with some embodiments.

In FIG. 9, a planarization process is applied to the insulation material 122. In some embodiments, the planarization process includes a chemical mechanical polish (CMP), an etch-back process, combinations thereof, or the like. As illustrated in FIG. 9, the planarization process may expose top surfaces of the first semiconductor fins 116A and the second semiconductor fins 116B. Portions of the first semiconductor fins 116A and the second semiconductor fins 116B may also be planarized by the planarization process. Top surfaces of the first semiconductor fins 116A, the second semiconductor fins 116B, and the insulation material 122 are level after the planarization process is complete.

Figure 10:
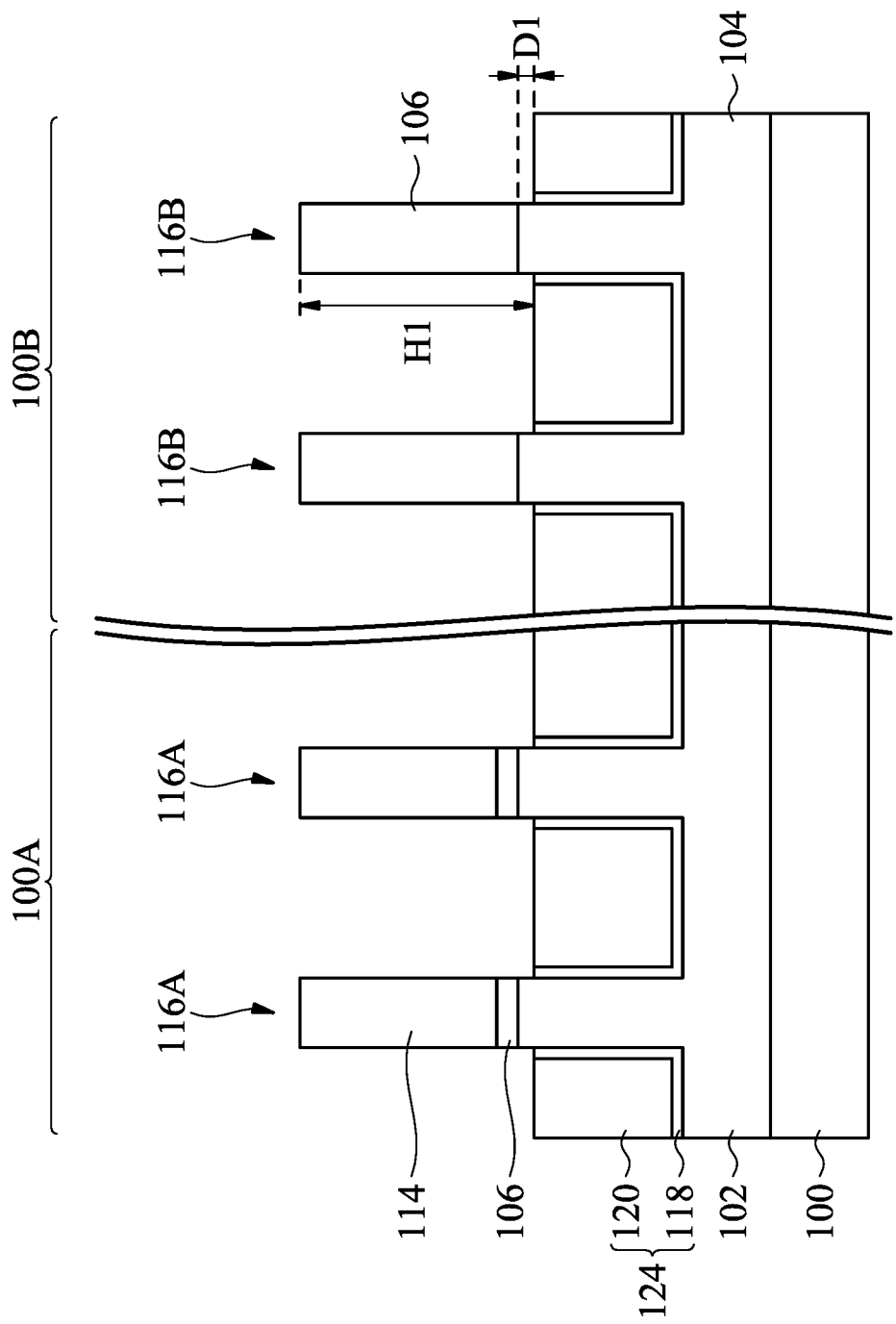
FIG. 10 illustrates a cross-sectional view of a formation of a shallow trench isolation (STI) region, in accordance with some embodiments.

In FIG. 10, the insulation material 122 is recessed to form shallow trench isolation (STI) regions 124. The insulation material 122 is recessed such that the first semiconductor fins 116A and the second semiconductor fins 116B in the first region 100A and in the second region 100B protrude from between neighboring STI regions 124. As illustrated in FIG. 10, the insulation material 122 may be recessed such that the first epitaxial layer 114, the second epitaxial layer 106, and at least portions of the n-well region 102 and the p-well region 104 protrude from the STI regions 124. The n-well region 102 and the p-well region 104 may protrude from the STI regions 124 by a distance D1 of between about 1 Å and about 100 Å. The exposed portions of the first semiconductor fins 116A and the second semiconductor fins 116B may have a height H1 measured from a top surface of the STI regions to top surfaces of the first semiconductor fins 116A and the second semiconductor fins 116B of between about 1 Å and about 10,000 Å. The STI regions 124 may be recessed using an acceptable etching process, such as one that is selective to the material of the STI regions 124. For example, a chemical oxide removal using a plasma-less gaseous etching process (e.g., an etching process using hydrogen fluoride (HF) gas, ammonia ($NH_3$) gas, or the like), a remote plasma assisted dry etch process (e.g., a process using hydrogen ($H_2$), nitrogen trifluoride ($NF_3$), and ammonia by-products, or the like), or dilute hydrofluoric (dHF) acid may be used.

Figure 11:
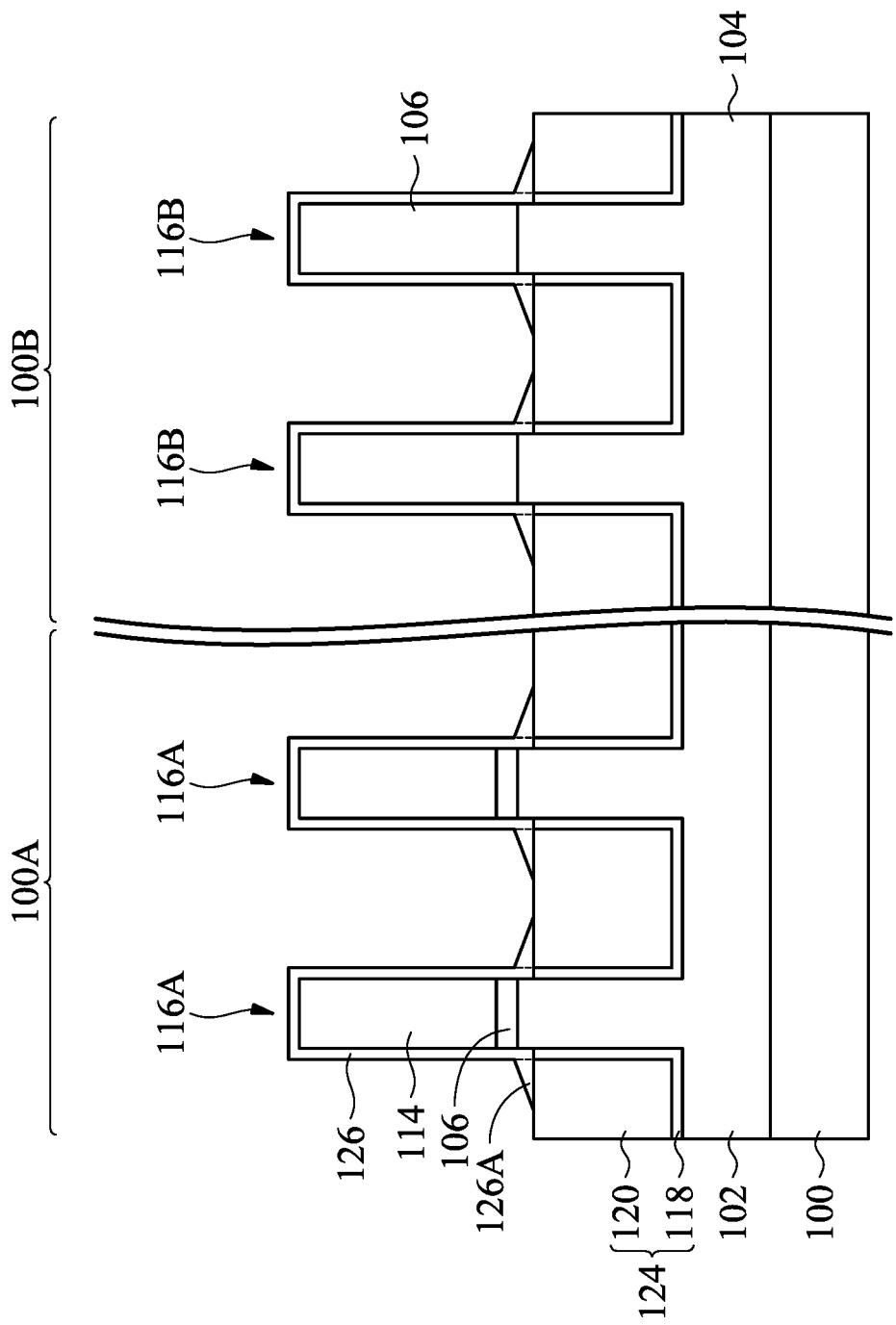
FIG. 11 illustrates a cross-sectional view of a formation of a cap layer over a semiconductor fin, in accordance with some embodiments.

In FIG. 11, a cap layer 126 is formed on exposed portions of the first semiconductor fins 116A and the second semiconductor fins 116B. The cap layer 126 may be formed over the first semiconductor fins 116A and the second semiconductor fins 116B to reduce out-diffusion of germanium from the first semiconductor fins 116A into subsequently formed overlying layers. In some embodiments, the cap layer 126 may be formed of silicon (e.g., poly-crystalline silicon) or the like. The cap layer 126 may have a thickness of between about 1 Å and about 10 Å. The cap layer 126 may be formed by CVD, furnace CVD, ALD, epitaxial growth, or the like. In a specific embodiment, the cap layer 126 may be formed by loading the substrate 100 illustrated in FIG. 10 into a furnace, performing a pre-clean process on the first semiconductor fins 116A and the second semiconductor fins 116B, performing a sublimation process, depositing the cap layer on the first semiconductor fins 116A and the second semiconductor fins 116B, and cooling the substrate 100.

As an initial step in forming the cap layer 126, a pre-clean process is performed on the exposed portions of the first semiconductor fins 116A and the second semiconductor fins 116B to remove a native oxide layer resulting from oxidation of the exposed surfaces of the first semiconductor fins 116A and the second semiconductor fins 116B. In some embodiments, the pre-clean may be performed using an HF-based gas, a SiCoNi-based gas, or the like. In other embodiments, the pre-clean may be performed using a wet etch with an etchant such as a solution including hydrofluoric acid (HF); although other etchants, such as $H_2$, and other methods, such as a reactive ion etch, a dry etch with etchants such as $NH_3/NF_3$, chemical oxide removal, or dry chemical clean may be used. In still further embodiments, the pre-clean may use an $NH_3$ remote plasma pre-clean process. The pre-clean process may be performed in situ after the substrate 100 is loaded into the furnace. In other embodiments, the pre-clean process may be performed ex situ before the substrate 100 is loaded into the furnace. The pre-clean process may be performed at a temperature of between about 50° C. and about 350° C. The pre-clean process may be performed for a period of between about 5 seconds and about 250 seconds. The pre-clean process may improve the adhesion of the cap layer 126 to the first semiconductor fins 116A and the second semiconductor fins 116B.

A sublimation process is performed in the furnace in order to prepare a precursor gas for depositing the cap layer 126. Precursors that may be used for the deposition of the cap layer 126 include silane ($SiH_4$), dichlorosilane ($SiH_2Cl_2$, also referred to as DCS), disilane ($Si_2H_6$), combinations thereof, or the like. In some embodiments, silicon may be sublimated in the presence of a carrier gas, such as hydrogen ($H_2$) gas. The sublimation process may be conducted in a hydrogen ambient atmosphere. The sublimation process may be performed at a temperature of between about 50° C. and about 300° C. During the sublimation process, the partial pressure of hydrogen gas in the furnace may be between about 1 mTorr and about 4 mTorr. The sublimation process may be used to stabilize the temperature, pressure, and precursor gas flowrate in the furnace prior to depositing the cap layer 126 on the first semiconductor fins 116A and the second semiconductor fins 116B.

The cap layer 126 is then deposited on the first semiconductor fins 116A and the second semiconductor fins 116B in a cap layer deposition process by raising the temperature of the furnace. In an embodiment, increasing the temperature of the furnace causes decomposition of the precursor gas and silicon from the precursor gas is deposited on the first semiconductor fins 116A and the second semiconductor fins 116B. The temperature of the furnace may be raised to a temperature of between about 350° C. and about 500° C. The furnace may have a pressure of between about 1 Torr and about 600 Torr. Hydrogen gas may be flowed over the substrate 100 during the cap layer 126 deposition process at a flowrate of between about 10 sccm and about 30000 sccm. The precursor gas (e.g., silane, dichlorosilane, disilane, combinations thereof, or the like) may be flowed over the substrate 100 during the cap layer 126 deposition process at a flowrate of between about 10 sccm and about 500 sccm. In some embodiments, the cap layer 126 deposition is performed for a time interval between about 50 seconds to 10,000 seconds. In alternative embodiments, the cap layer 126 deposition is performed for a time interval between about 50 seconds to 200 seconds.

The combination of the cap layer 126 and the first semiconductor fins 116A may function as a p-type channel in subsequently formed transistors and the combination of the cap layer 126 and the second semiconductor fins 116B may function as an n-type channel in subsequently formed transistors. Forming the first semiconductor fins 116A of silicon germanium results in p-type fully strained channels having reduced channel resistance (e.g., $R_{channel}$) and highly efficient mobility. The first semiconductor fins 116A may provide to better drain-induced barrier lowering (DIBL) and Ion-Ioff performance than semiconductor fins formed by alternative processes or including different materials. Forming the cap layer 126 over the first semiconductor fins 116A reduces defects in the first semiconductor fins 116A formed of silicon germanium.

The cap layer 126 deposited on the first semiconductor fins 116A and second semiconductor fins 116B may comprise crystalline silicon. During the growth of the crystalline Si cap layer 126, amorphous Si might grow over the adjacent STI regions, resulting in amorphous Si "wings" 126A extending from the Si cap, illustrated in FIG. 11. These "wings" can degrade device performance, such as DIBL, threshold voltage, and interface trapping density. This phenomenon of the undesirable amorphous silicon formation resulting from the Si cap formation process is sometimes termed selective loss or selectivity loss, because in an ideal process, the Si would grow only on the exposed SiGe, not on the STI—i.e. complete selectivity.

Figure 12:
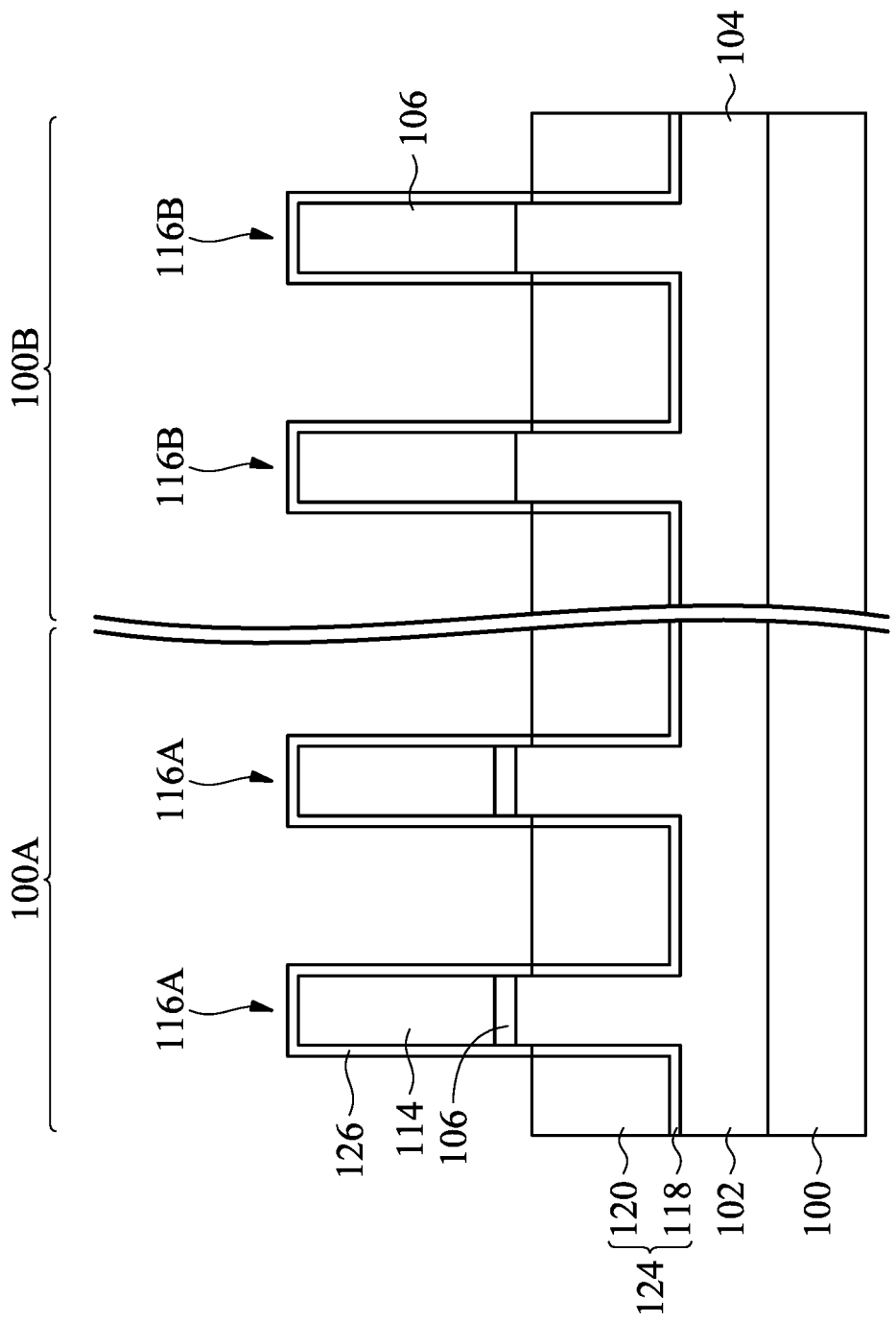
FIG. 12 illustrates a cross-sectional view of an etch back of a "wing" of the cap layer over the adjacent STI region, in accordance with some embodiments.
Figure 13:
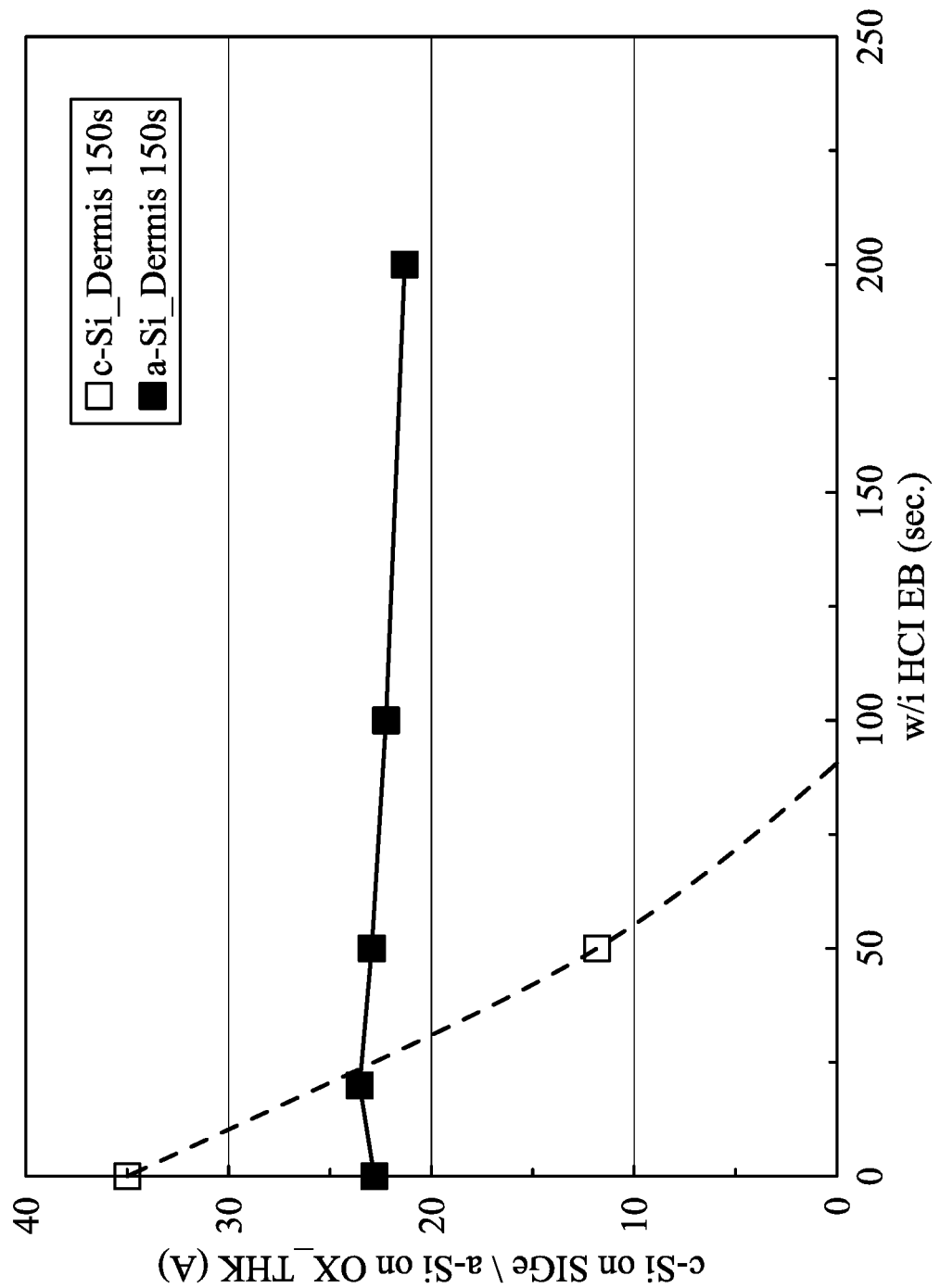
FIG. 13 illustrates the different etch rates of HCl on crystalline silicon (c-Si) and amorphous silicon (a-Si).

In FIG. 12, an HCl etch, sometimes referred to as an HCl bake, is applied to the cap layer 126 to selectively remove undesirable amorphous Si "wings" 126A over the exposed regions of the liner 118 and the STI regions 124 without substantially etching or removing the desirable crystalline Si cap 126. The temperature of the furnace may be raised to a temperature of between about 550° C. and about 650° C., and the pressure may be raised to between about 10 Torr and about 500 Torr. During this bake, a wet etch process with HCl is performed by applying HCl to the cap layer 126 and the amorphous Si "wings" 126A for a time interval of between about 10 seconds to about 100 seconds. Because the etch rate of HCl on amorphous silicon is higher than the etch rate of HCl on crystalline silicon, the amorphous silicon "wings" 126A will be etched away when the cap layer 126 made up of crystalline silicon will be minimally effected. FIG. 13 illustrates the different etch rates of HCl on crystalline silicon (c-Si) and amorphous silicon (a-Si). In an HCl etch bake (EB), a thickness of a-Si is etched from about 35 Å to 0 in less than 100 seconds, while a thickness of c-Si is etched much slower, going from about 24 Å to about 22 Å in 200 seconds.

The substrate 100 is then cooled. The substrate 100 may be cooled by flowing a cooling gas (e.g., a nitrogen ($N_2$) gas or the like) over the substrate 100, or by using a water coil or the like. The cooling gas may have a temperature of between about 25° C. and about 380° C. The substrate 100 may be cooled for a period of between about 20 seconds and about 120 seconds. The substrate 100 may be cooled to a temperature of between about 60° C. and about 18° C.

Figure 14A:
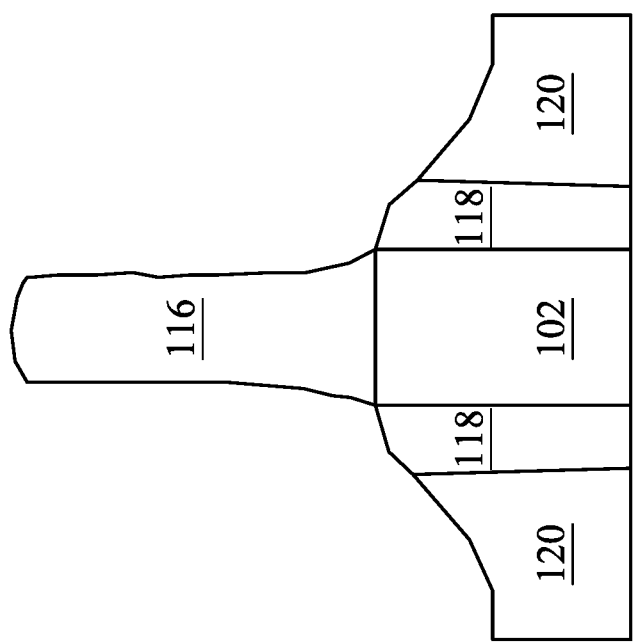
FIGS. 14A-14G illustrate a cross-sectional view of a formation of a cap layer, an etch back of a "wing" of the cap layer over the adjacent STI region and an adjacent liner, a formation of an IO oxide over the semiconductor fin, and a removal of the IO oxide, in accordance with some embodiments.

FIG. 14A illustrates another embodiment of a device wherein a SiGe fin 116 has been grown on a Si strip 102. FIG. 14B illustrates the device after a crystalline Si cap layer 126 has been grown covering the SiGe fin 116. During the growth of the crystalline Si cap 126, amorphous Si might grow over the adjacent STI regions 120 and liner 118, resulting in amorphous Si "wings" 126A extending from the Si cap layer 126.

Figure 14C:
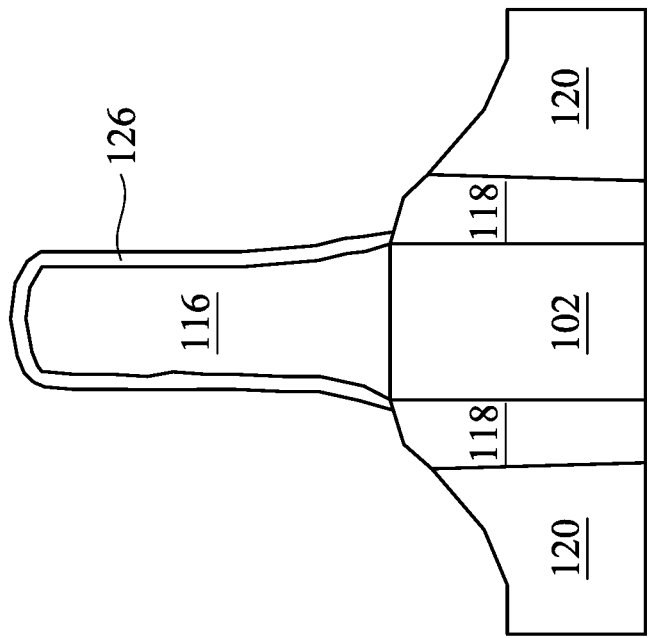
Figure 14B:
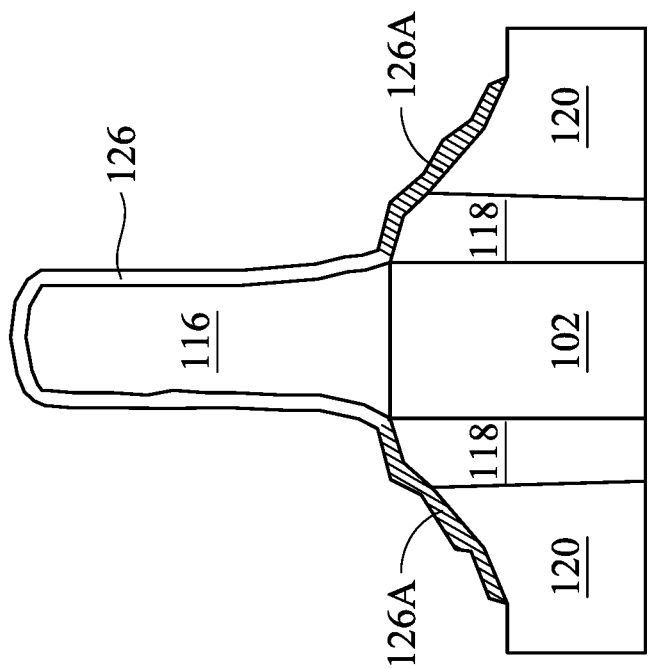

FIG. 14C illustrates the structure of FIG. 14B after an HCl etch, sometimes referred to as an HCl bake, has been performed. As shown, the HCl etch removes the undesirable amorphous Si "wings" 126A without substantially etching or removing the desirable crystalline Si cap 126. In additional embodiments, the etch back process could be a process that provides the same or nearly the same levels of etching and etch selectivity, such as an HBr etch, a controlled Cl etch or the like.

In an embodiment, the process resulting in FIG. 14C can include the following steps: (Step 1) Perform a pre-clean for the surface of SiGe fin 116. (Step 2) Deposit a Si cap 126 at a temperature of 400° C. to 470° C. region, and under Hydrogen ambient to prevent Ge segregation. (Step 3) Ramp up process temperature to about 550° C. to about 600° C., and ramp up pressure to about 200 Torr to about 500 Torr, and then introduce HCl for the etching of the amorphous Si "wings" 126A. One skilled in the art will recognize that these process conditions are for illustration only and that additional variations and additions to these steps can be obtained through application of routine experimentation and knowledge in the art.

Figure 14E:
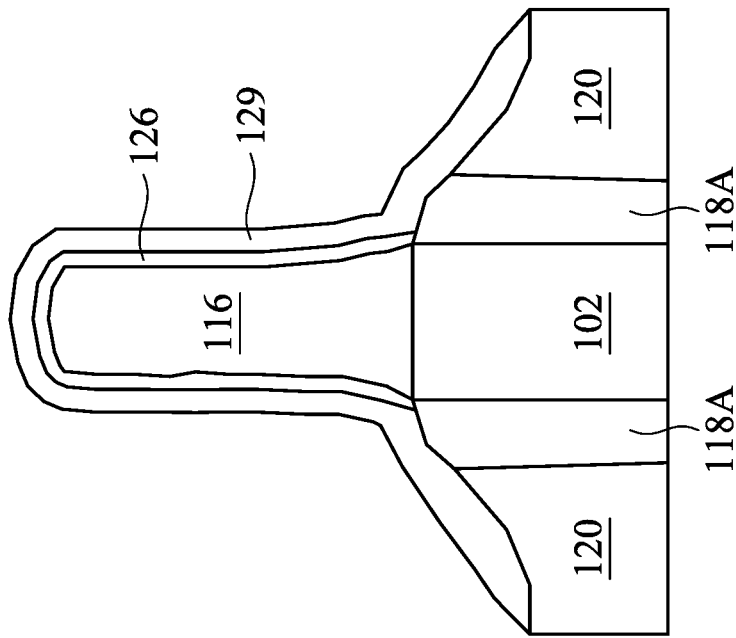
Figure 14D:
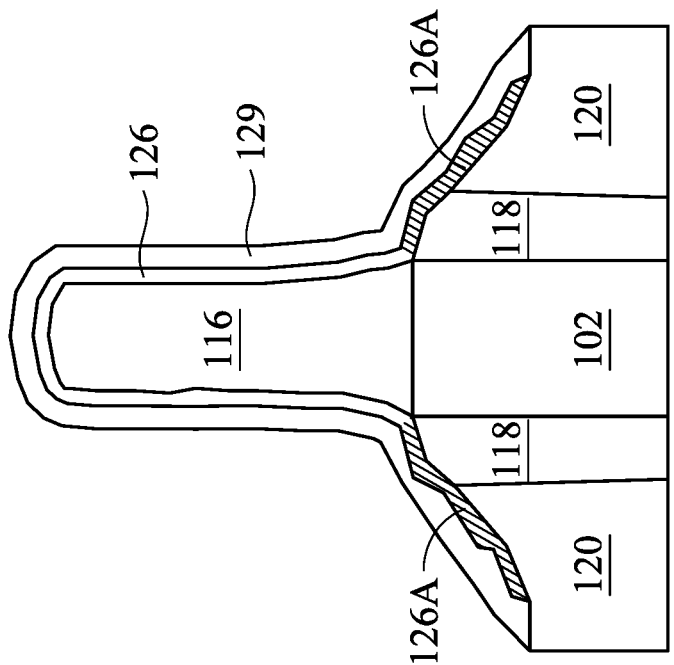
Figure 14G:
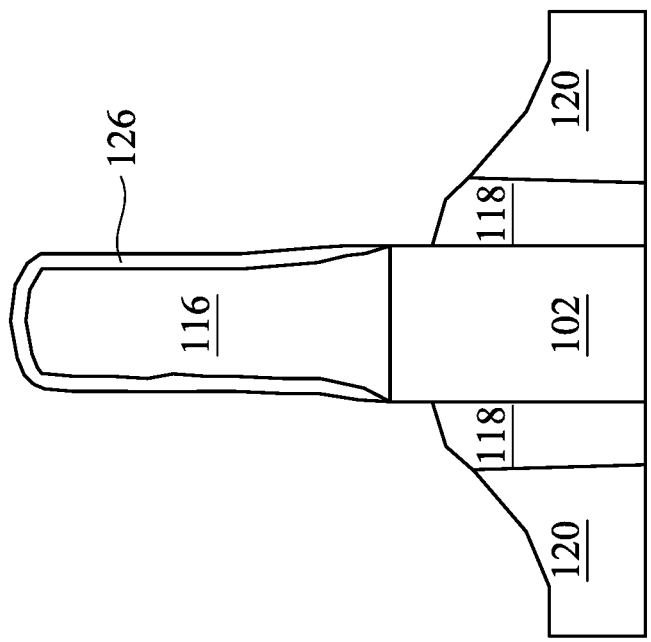
Figure 14F:
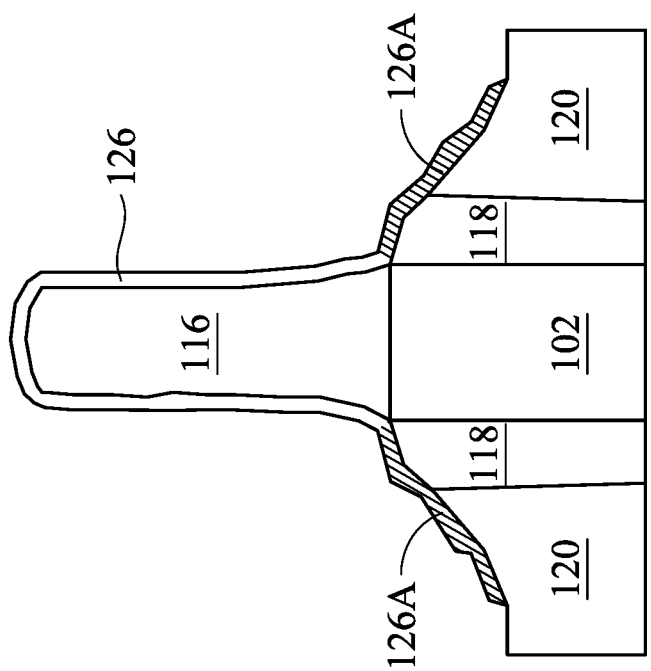

Further processing may include formation of an oxide layer over the fin, in some embodiments. FIGS. 14D-14G illustrate such embodiments. FIG. 14D illustrates the illustrative structure of FIG. 14B, without performing an HCl etch to remove the amorphous Si "wings" 126A, after an oxide layer 129 has been formed over the fin. FIG. 14E illustrates the illustrative structure of FIG. 14C, in which the HCl etch has removed the amorphous Si "wings" 126A, after an oxide layer 129 has been formed over the fin. With the amorphous Si "wings" 126A removed, portions of the underlying liner and/or STI material may also be oxidized when the oxide layer 129 is formed. The oxide layer 129 could be an I/O oxide (so-called IOOX) in some embodiments, a gate dielectric, or some other liner or layer. In some embodiments, the oxide layer 129 is annealed after deposition. In the case of an IOOX oxide, it may be desirable to remove the oxide from some structures, such as the device illustrated in FIG. 14F and 14G, wherein the IOOX oxide liner 129 has been removed from the illustrative structures of FIG. 14D and 14E, respectively. In some embodiments, the oxide layer 129 is removed with a dry etch process that may comprise HF and $NH_4$. Because the amorphous silicon "wings" 126A have been removed previously in FIG. 14E, they do not mask the oxidized underlying liner and/or STI material ii8A and hence that material may also be etched back during the IOOX removal process—resulting in an increased height for the resulting fin in FIG. 14G relative to the fin in FIG. 14F. This is illustrated at least in part by the gap between the bottom of the Si cap layer 126 and the top of the liner 118 in FIG. 14G. In some embodiments illustrated by FIG. 14G, the resulting SiGe fin 116 may comprise a height of about 40 to 60 nm and a width of about 5 to 10 nm. The lower portion of the fin comprising silicon 102 which extends above the top surface of the liner 118 may comprise a height of about 5 to 15 nm (between the upper surface of liner 118 and the lower surface of SiGe fin 116) and a width of about 5 to 10 nm.

FIGS. 15A through 24B illustrate various additional steps in the manufacturing of embodiment devices following from FIG. 12. FIGS. 15B, 16B, 17B, 18B-D, 19B, 20B, 21B, 22B, 23B, and 24B illustrate features in either of the first region 100A and the second region 100B. For example, the structures illustrated in FIGS. 15B, 16B, 17B, 18B-D, 19B, 20B, 21B, 22B, 23B, and 24B may be applicable to both the first region 100A and the second region 100B. Differences (if any) in the structures of the first region 100A and the second region 100B are described in the text accompanying each figure.

Figure 15A:
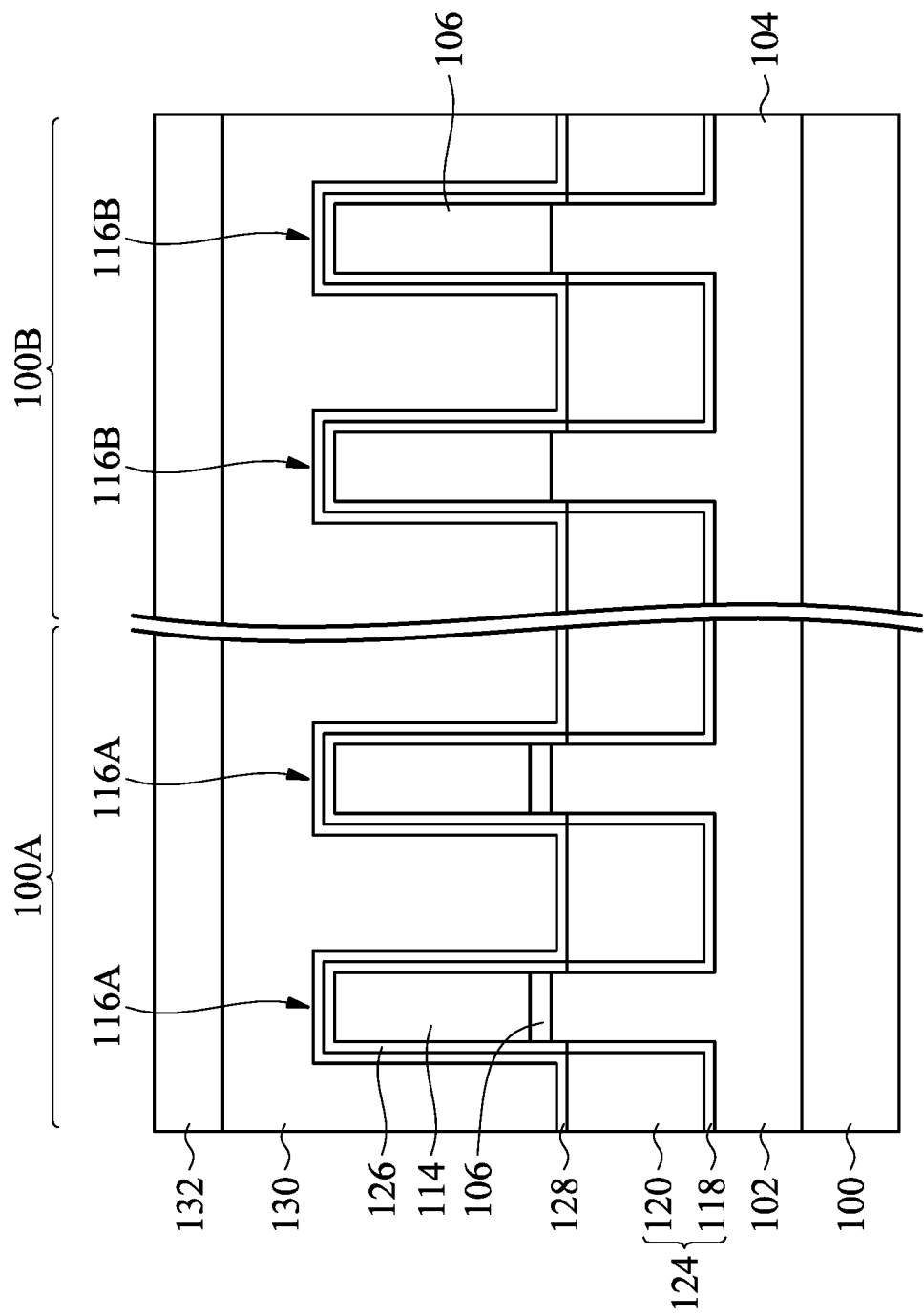
FIGS. 15A and 15B illustrate cross-sectional views of a formation of a dummy dielectric layer, a dummy gate layer, and a mask layer, in accordance with some embodiments.
Figure 15B:
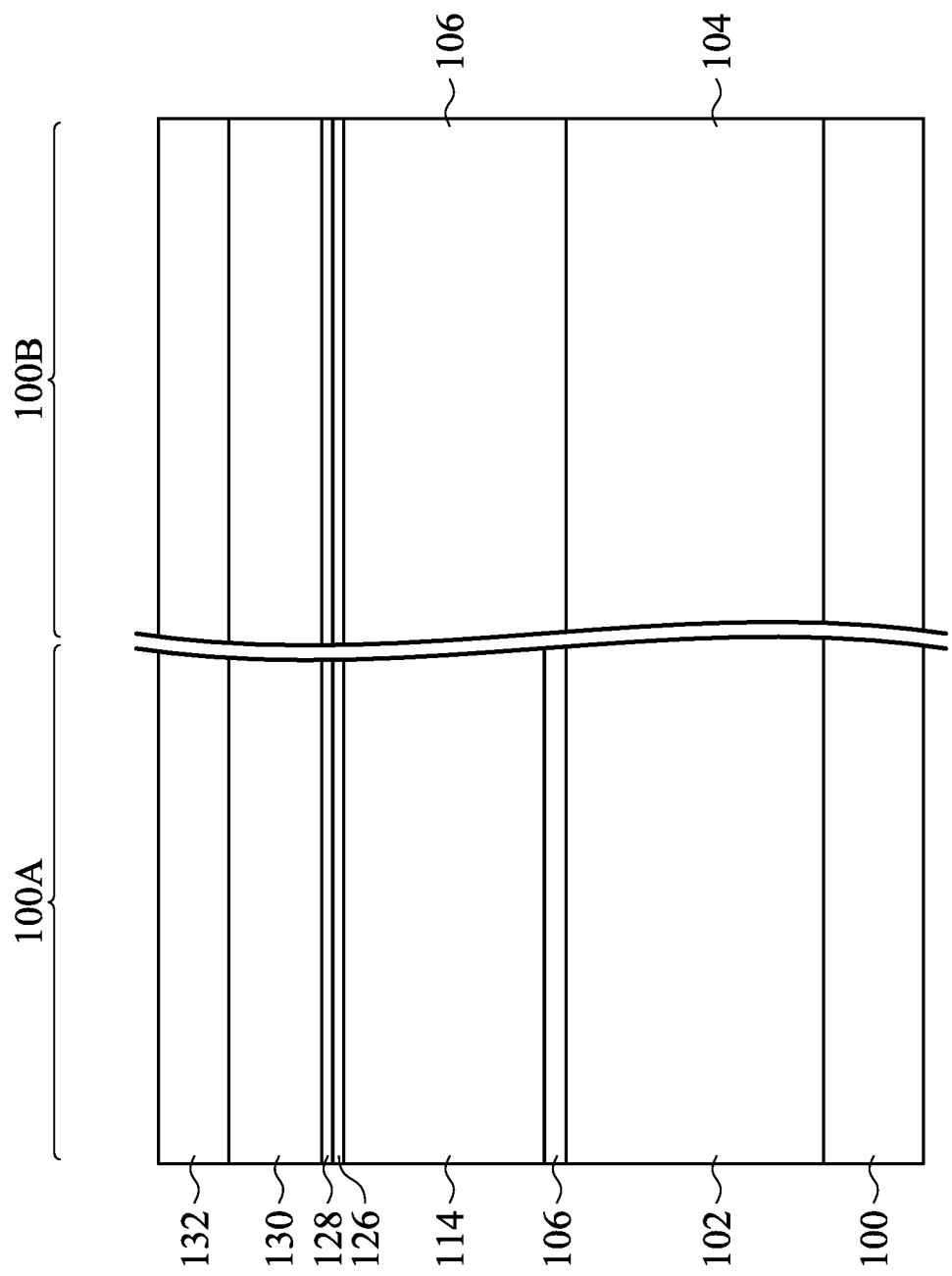

In FIGS. 15A and 15B, a dummy dielectric layer 128 is formed over the cap layer 126 and the STI regions 124. The dummy dielectric layer 128 may be, for example, silicon oxide, silicon nitride, a combination thereof, or the like, and may be deposited or thermally grown according to acceptable techniques. A dummy gate layer 130 is formed over the dummy dielectric layer 128, and a mask layer 132 is formed over the dummy gate layer 130. The dummy gate layer 130 may be deposited over the dummy dielectric layer 128 and then planarized, such as by a CMP. The mask layer 132 may be deposited over the dummy gate layer 130. The dummy gate layer 130 may be a conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 130 may be deposited by physical vapor deposition (PVD), CVD, sputter deposition, or other techniques known and used in the art for depositing conductive materials. The dummy gate layer 130 may be made of other materials that have a high etching selectivity from the etching of isolation regions. The mask layer 132 may include, for example, SiN, SiON, or the like. In this example, a single dummy gate layer 130 and a single mask layer 132 are formed across the regions in which the first semiconductor fins 116A and the second semiconductor fins 116B are formed. In some embodiments, separate dummy gate layers 130 and separate mask layers 132 may be formed in the region in which the first semiconductor fins 116A are formed and the region in which the second semiconductor fins 116B are formed.

Figure 16A:
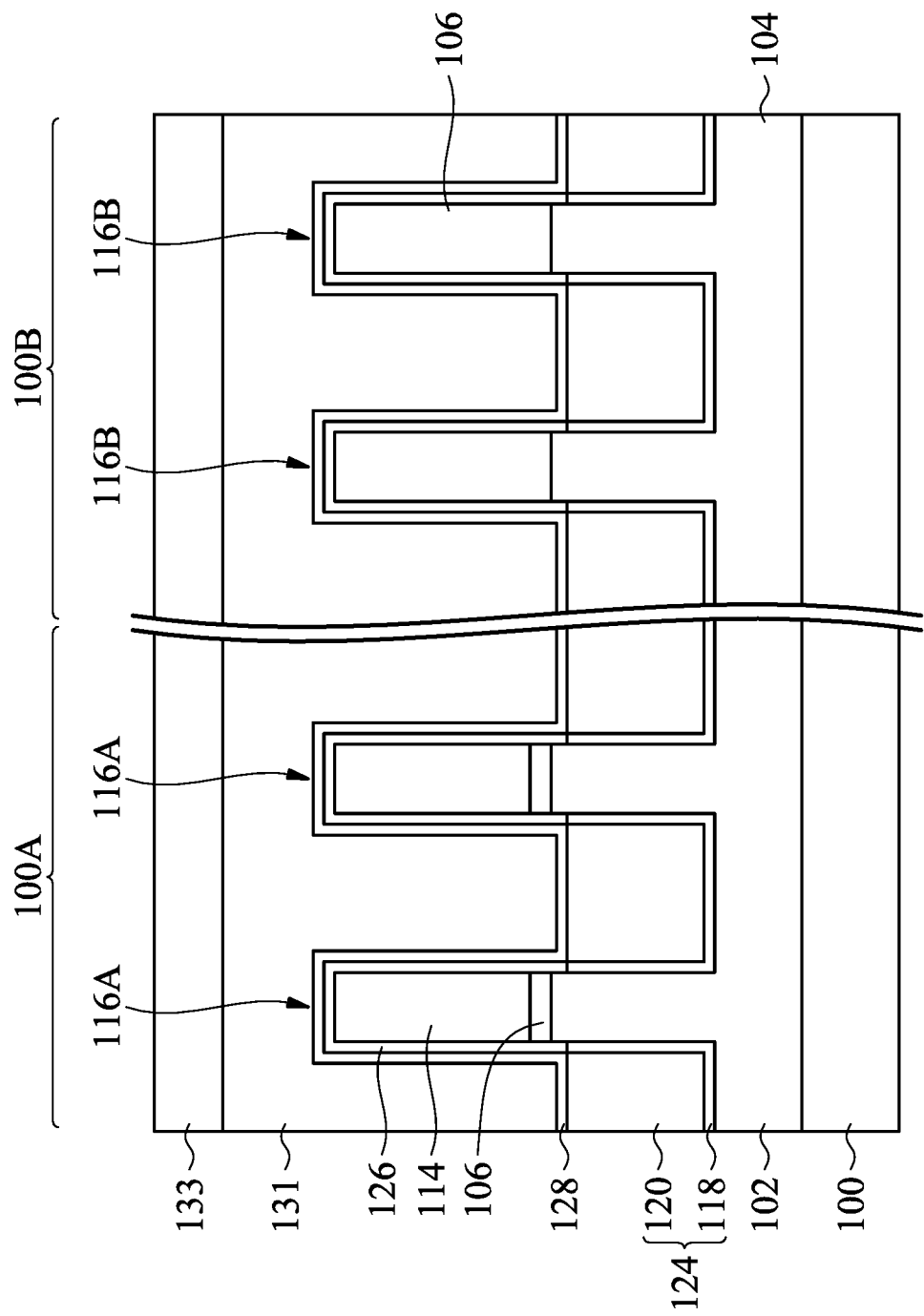
FIGS. 16A and 16B illustrate cross-sectional views of a formation of a dummy gate, masks, and gate seal spacers, in accordance with some embodiments.
Figure 16B:
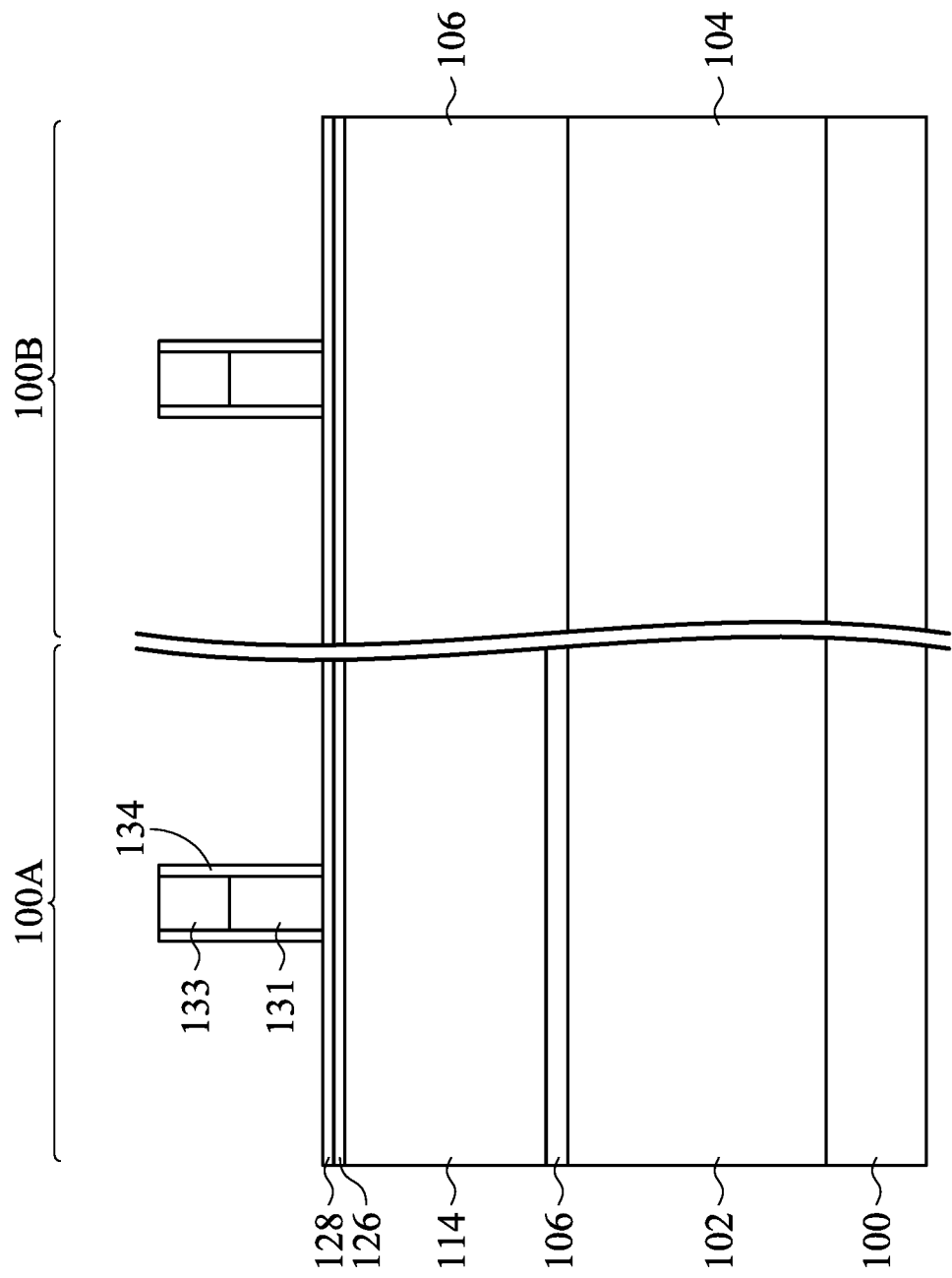

In FIGS. 16A and 16B, the mask layer 132 may be patterned using acceptable photolithography and etching techniques to form masks 133. The pattern of the masks 133 may be transferred to the dummy gate layer 130 by an acceptable etching technique to form dummy gates 131. In some embodiments, the pattern of the masks 133 may also be transferred to the dummy dielectric layer 128. The dummy gates 131 cover respective channel regions of the first semiconductor fins 116A and the second semiconductor fins 116B. The pattern of the masks 133 may be used to physically separate each of the dummy gates 131 from adjacent dummy gates 131. The dummy gates 131 may also have a lengthwise direction substantially perpendicular to the lengthwise direction of the first semiconductor fins 116A and the second semiconductor fins 116B.

As further illustrated in FIG. 16B, gate seal spacers 134 may be formed on exposed sidewalls of the dummy gates 131, the masks 133, and/or the first semiconductor fins 116A and the second semiconductor fins 116B. A thermal oxidation or a deposition followed by an anisotropic etch may be used to form the gate seal spacers 134. Although only one gate seal spacer 134 is illustrated in FIG. 16B, the gate seal spacers 134 may comprise a plurality of layers.

After the formation of the gate seal spacers 134, implants for lightly doped source/drain (LDD) regions (not explicitly illustrated) may be performed. In the embodiments with different device types, a mask, such as a photoresist, may be formed over the first region 100A, while exposing the second region 100B, and appropriate type (e.g., n-type) impurities may be implanted into the exposed second semiconductor fins 116B in the second region 100B. The mask may then be removed. Subsequently, a mask, such as a photoresist, may be formed over the second region 100B while exposing the first region 100A, and appropriate type (e.g., p-type) impurities may be implanted into the exposed first semiconductor fins 116A in the first region 100A. The mask may then be removed. The n-type impurities may be phosphorus, arsenic, or the like, and the p-type impurities may be boron, $BF_2$, or the like. The lightly doped source/drain regions may have a concentration of impurities of from about $10^{15}$ cm$^{-3}$ to about $10^{16}$ cm$^{-3}$. An anneal may be used to activate the implanted impurities.

Figure 17A:
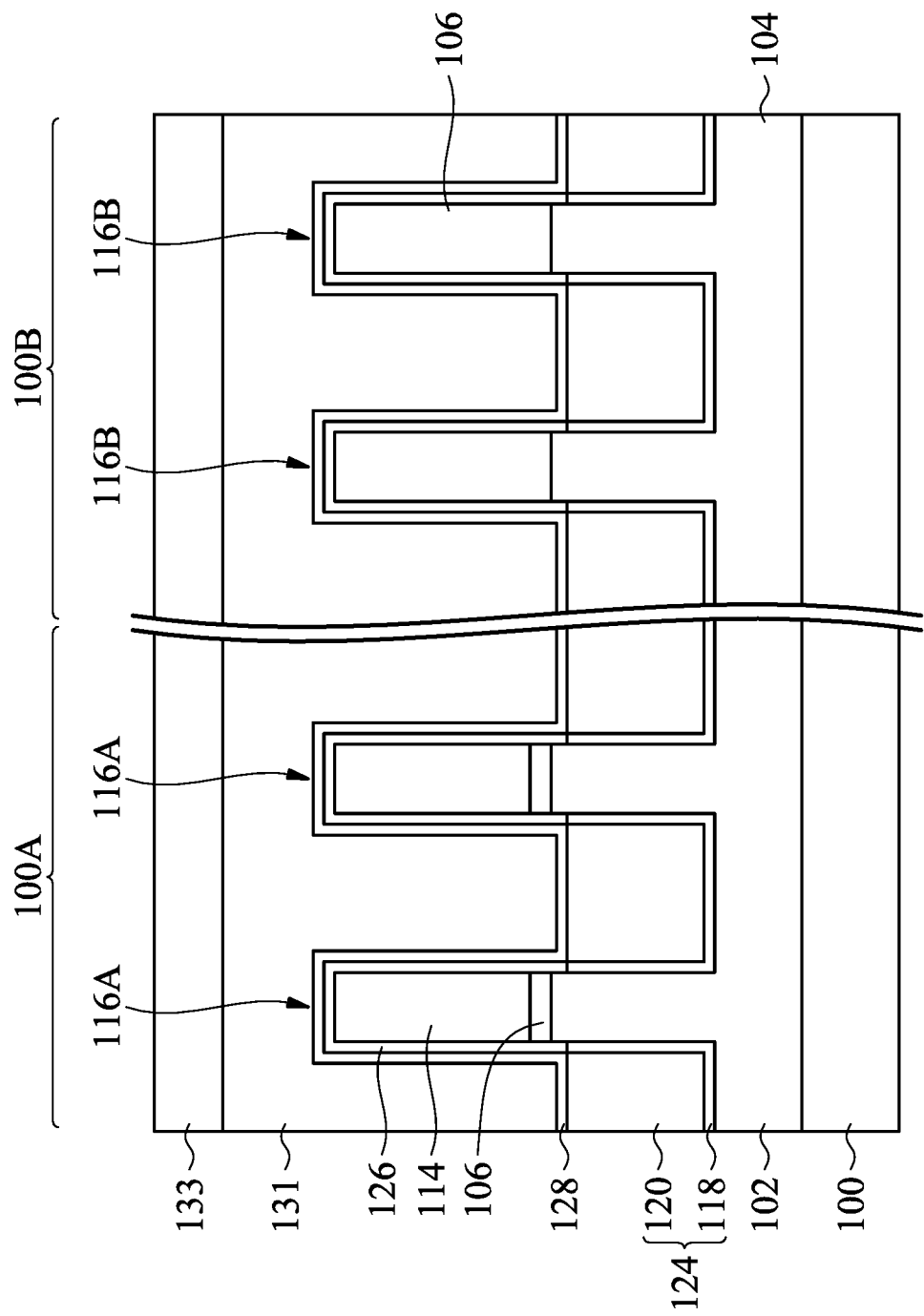
FIGS. 17A and 17B illustrate cross-sectional views of a formation of gate spacers, in accordance with some embodiments.
Figure 17B:
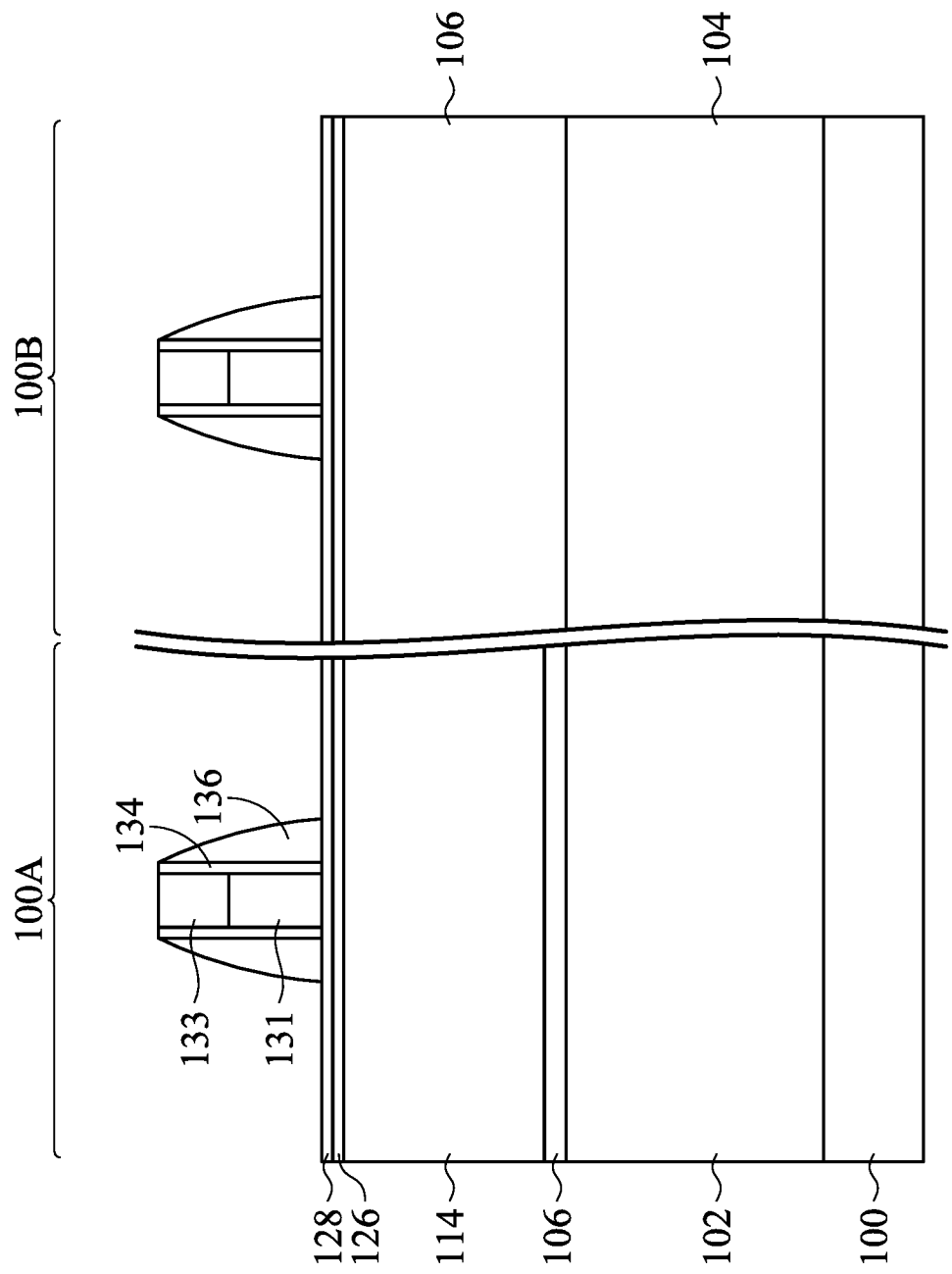

In FIGS. 17A and 17B, gate spacers 136 are formed on the gate seal spacers 134 along sidewalls of the dummy gates 131 and the masks 133. The gate spacers 136 may be formed by conformally depositing a material and subsequently anisotropically etching the material. The material of the gate spacers 136 may be silicon nitride, SiCN, a combination thereof, or the like. The gate spacers 136 may comprise a single layer or multiple layers.

In FIGS. 18A-18D epitaxial source/drain regions 138 are formed in the first semiconductor fins 116A and the second semiconductor fins 116B. The epitaxial source/drain regions 138 are formed in the first semiconductor fins 116A and the second semiconductor fins 116B such that each dummy gate 131 is disposed between respective neighboring pairs of the epitaxial source/drain regions 138. In some embodiments, the epitaxial source/drain regions 138 may extend into the first semiconductor fins 116A and the second semiconductor fins 116B. In some embodiments, the gate spacers 136 are used to separate the epitaxial source/drain regions 138 from the dummy gates 131 by an appropriate lateral distance so that the epitaxial source/drain regions 138 do not short out subsequently formed gates of the resulting FinFETs.

The epitaxial source/drain regions 138 in the first region 100A (e.g., the PMOS region) may be formed by masking the second region 100B (e.g., the NMOS region) and etching source/drain regions of the first semiconductor fins 116A in the first region 100A to form recesses in the first semiconductor fins 116A. Then, the epitaxial source/drain regions 138 in the first region 100A are epitaxially grown in the recesses. In some embodiments, the epitaxial source/drain regions 138 may extend through the second epitaxial layer 114 and the first epitaxial layer 106 into the n-well region 102 in the first region 100A. The epitaxial source/drain regions 138 may include any acceptable material appropriate for p-type FinFETs. For example, the epitaxial source/drain regions 138 in the first region 100A may include SiGe, SiGeB, Ge, GeSn, or the like. The epitaxial source/drain regions 138 in the first region 100A may be formed of a material having a greater lattice constant than the lattice constant of the second epitaxial layer 114, creating a compressive stress in the channel region to increase hole mobility for PMOS devices. The epitaxial source/drain regions 138 in the first region 100A may have surfaces raised from respective surfaces of the first semiconductor fins 116A and may have facets.

The epitaxial source/drain regions 138 in the second region 100B (e.g., the NMOS region) may be formed by masking the first region 100A (e.g., the PMOS region) and etching source/drain regions of the second semiconductor fins 116B in the second region 100B to form recesses in the second semiconductor fins 116B. Then, the epitaxial source/drain regions 138 in the second region 100B are epitaxially grown in the recesses. The epitaxial source/drain regions 138 may include any acceptable material, such as appropriate for n-type FinFETs. For example, the epitaxial source/drain regions 138 in the second region 100B may include silicon, SiC, SiCP, SiP, or the like. The epitaxial source/drain regions 138 in the second region 100B may be formed of a material having a smaller lattice constant than the lattice constant of the first epitaxial layer 106, creating a tensile stress in the channel region to increase electron mobility for NMOS devices. The epitaxial source/drain regions 138 in the second region 100B may also have surfaces raised from respective surfaces of the second semiconductor fins 116B and may have facets.

The epitaxial source/drain regions 138 and/or the first semiconductor fins 116A and the second semiconductor fins 116B may be implanted with dopants to form source/drain regions, similar to the process previously discussed for forming lightly doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 138 may be in situ doped during growth.

As a result of the epitaxy processes used to form the epitaxial source/drain regions 138 in the first region 100A and the second region 100B, upper surfaces of the epitaxial source/drain regions 138 have facets which expand laterally outward beyond a sidewalls of the first semiconductor fins 116A and the second semiconductor fins 116B. In some embodiments, these facets cause adjacent source/drain regions 138 to merge as illustrated by FIG. 18C. In other embodiments, adjacent source/drain regions 138 remain separated after the epitaxy process is completed as illustrated by FIG. 18D. The epitaxial source/drain regions 138 formed in the first semiconductor fins 116A or the second semiconductor fins 116B may be merged, as illustrated in FIG. 18C, or separated, as illustrated in FIG. 18D.

Figure 18A:
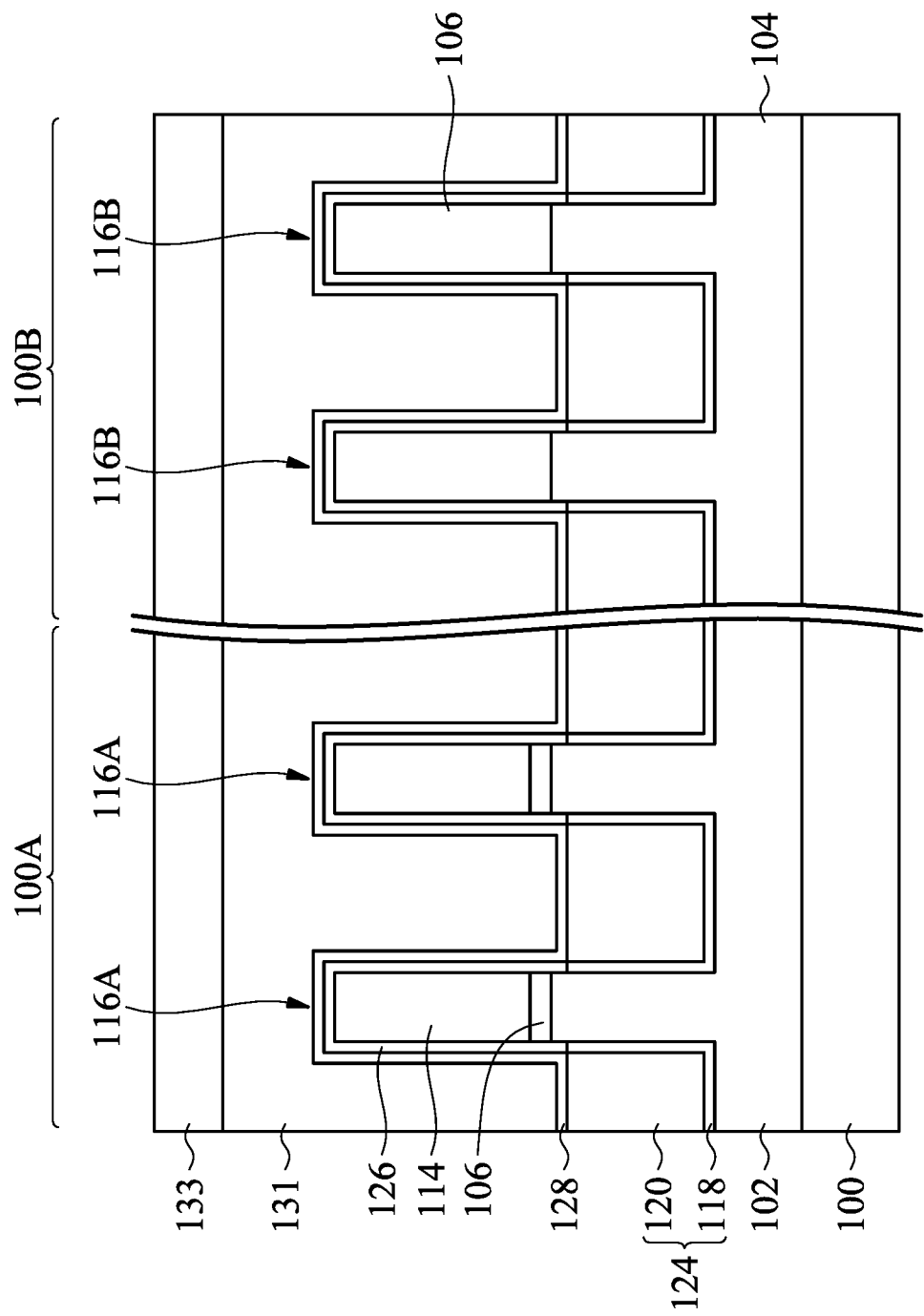
FIGS. 18A-18D illustrate cross-sectional views of a formation of epitaxial source/drain regions, in accordance with some embodiments.
Figure 18B:
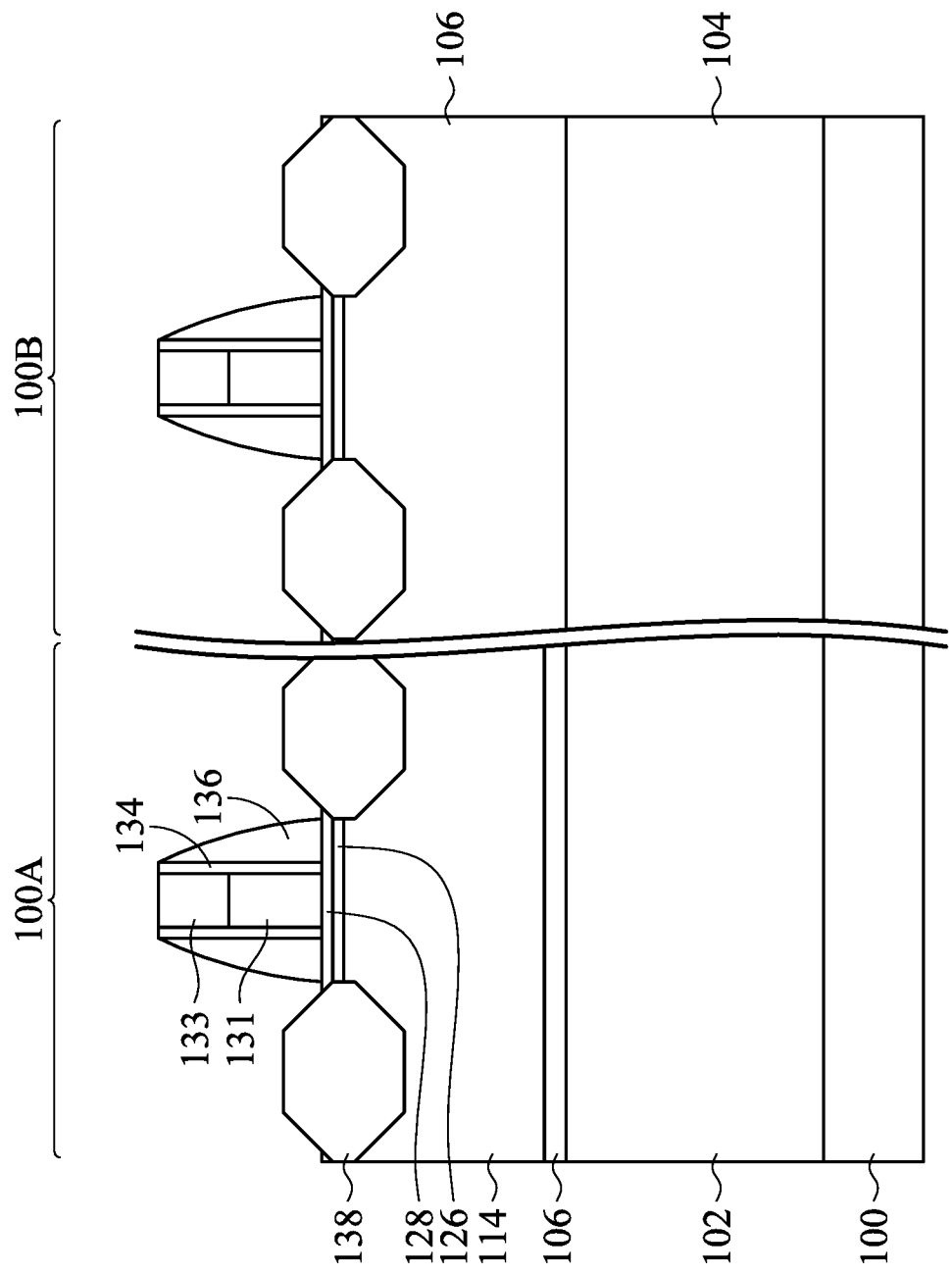
Figure 18C:
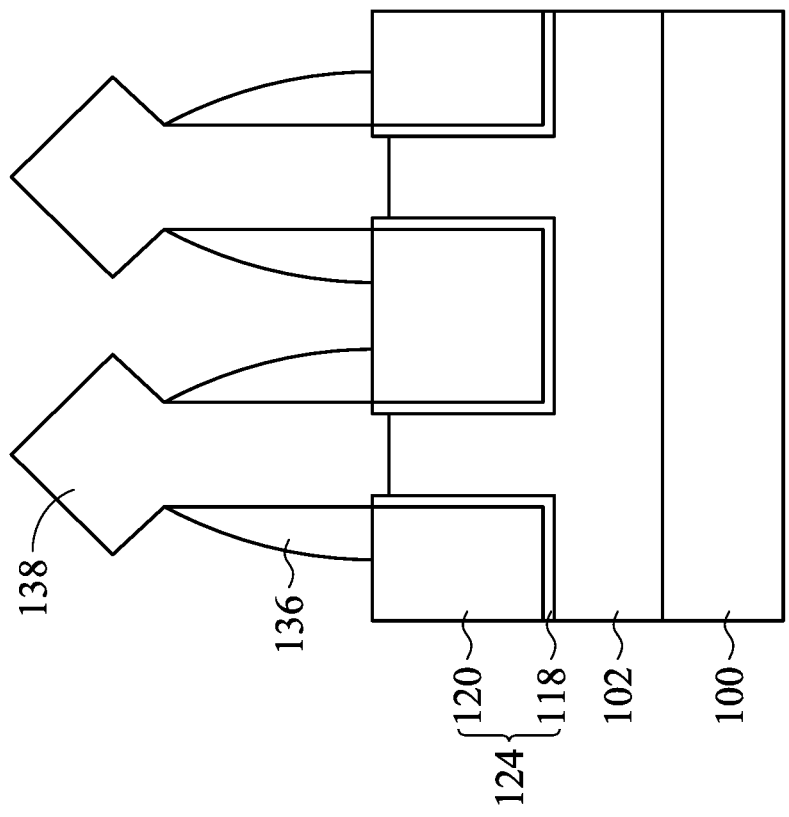
Figure 18D:
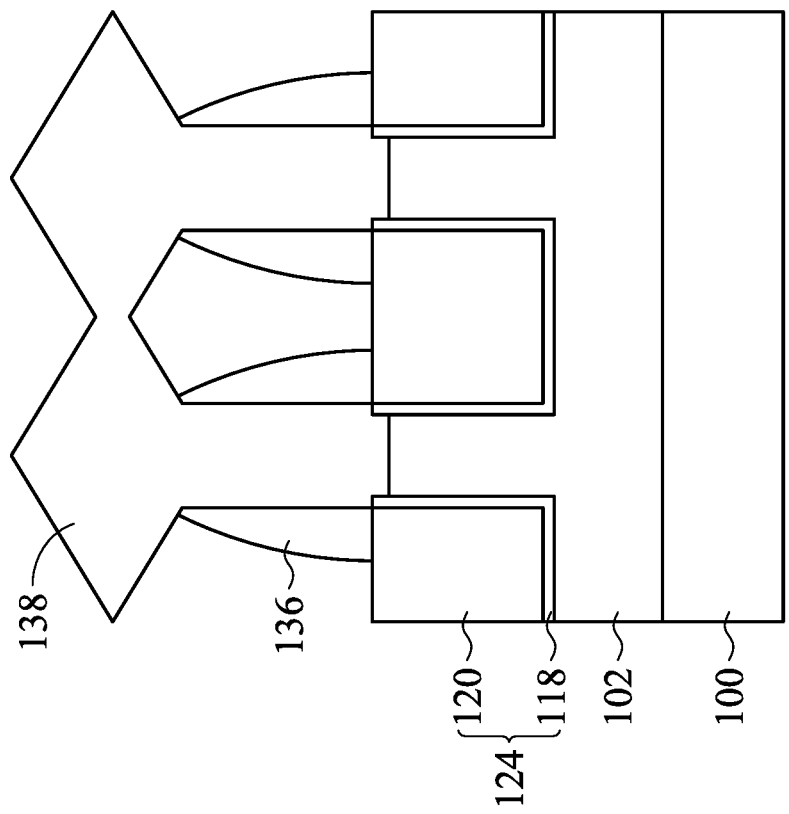
Figure 19A:
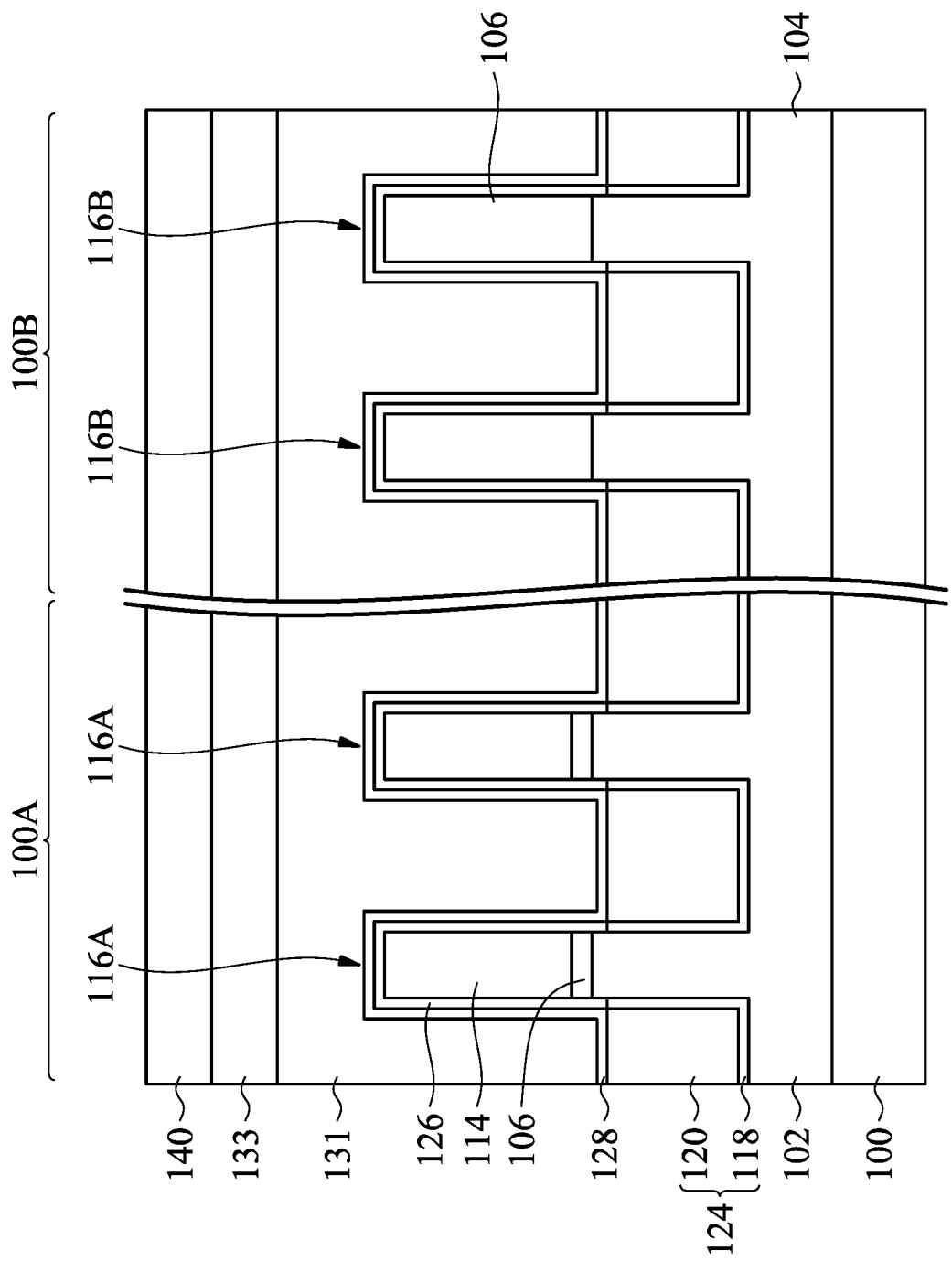
FIGS. 19A and 19B illustrate cross-sectional views of a formation of a first interlayer dielectric, in accordance with some embodiments.
Figure 19B:
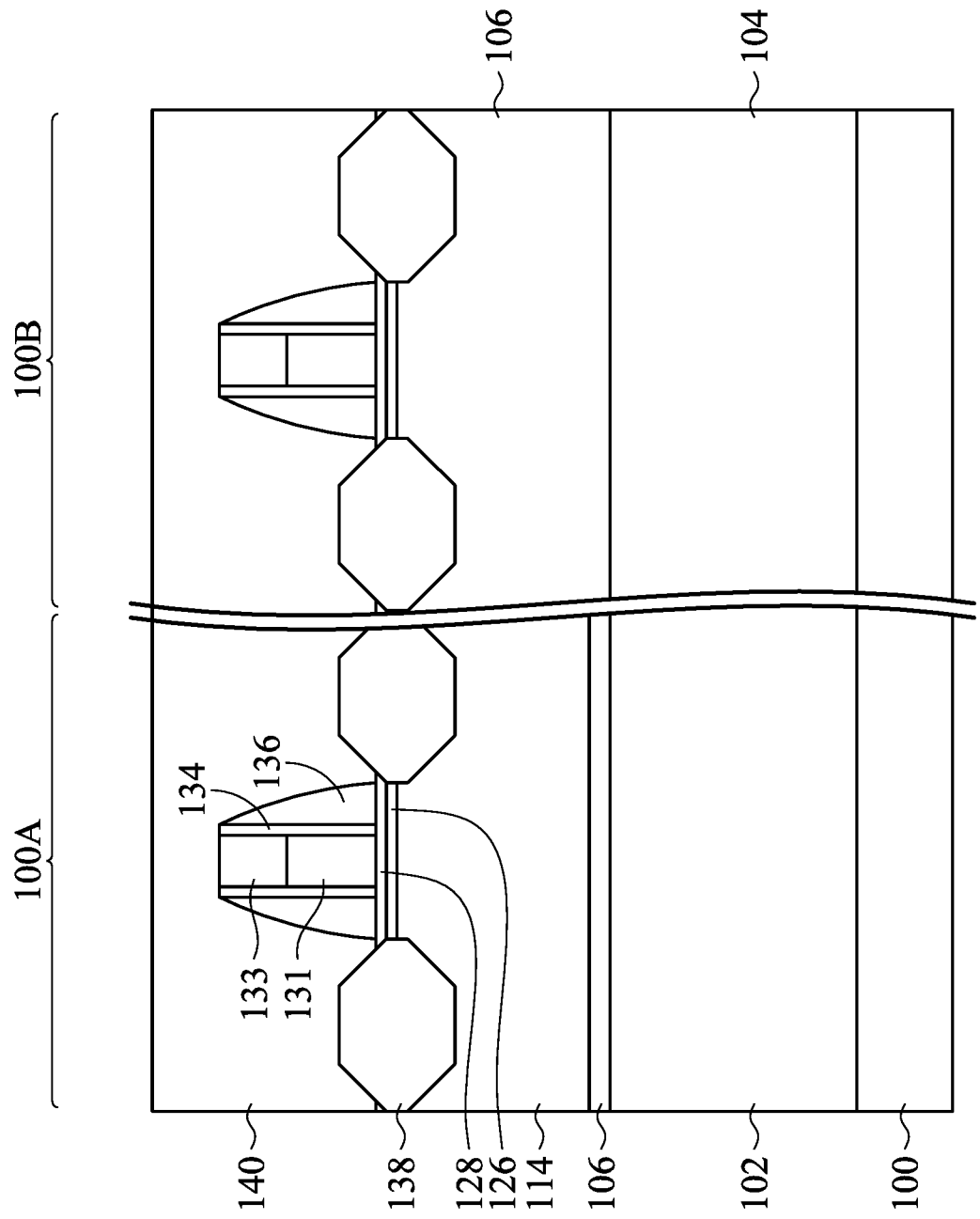

In FIGS. 19A and 19B, a first interlayer dielectric (ILD) 140 is deposited over the structure illustrated in FIGS. 18A and 18B. The first ILD 140 may be formed of a dielectric material or a semiconductor material, and may be deposited by any suitable method, such as CVD, plasma-enhanced CVD (PECVD), or flowable CVD (FCVD). Dielectric materials may include phosphosilicate glass (PSG), borosilicate glass (BSG), boron-doped phosphosilicate glass (BPSG), undoped silicate glass (USG), or the like. Semiconductor materials may include amorphous silicon (a-Si), silicon germanium ($Si_xGe_{1-x}$, where x may be between approximately 0 and 1), pure germanium, or the like. Other insulation or semiconductor materials formed by any acceptable process may be used. In some embodiments, a contact etch stop layer (CESL, not separately illustrated), is disposed between the first ILD 140 and the epitaxial source/drain regions 138, the masks 133, and the gate spacers 136.

Figure 20A:
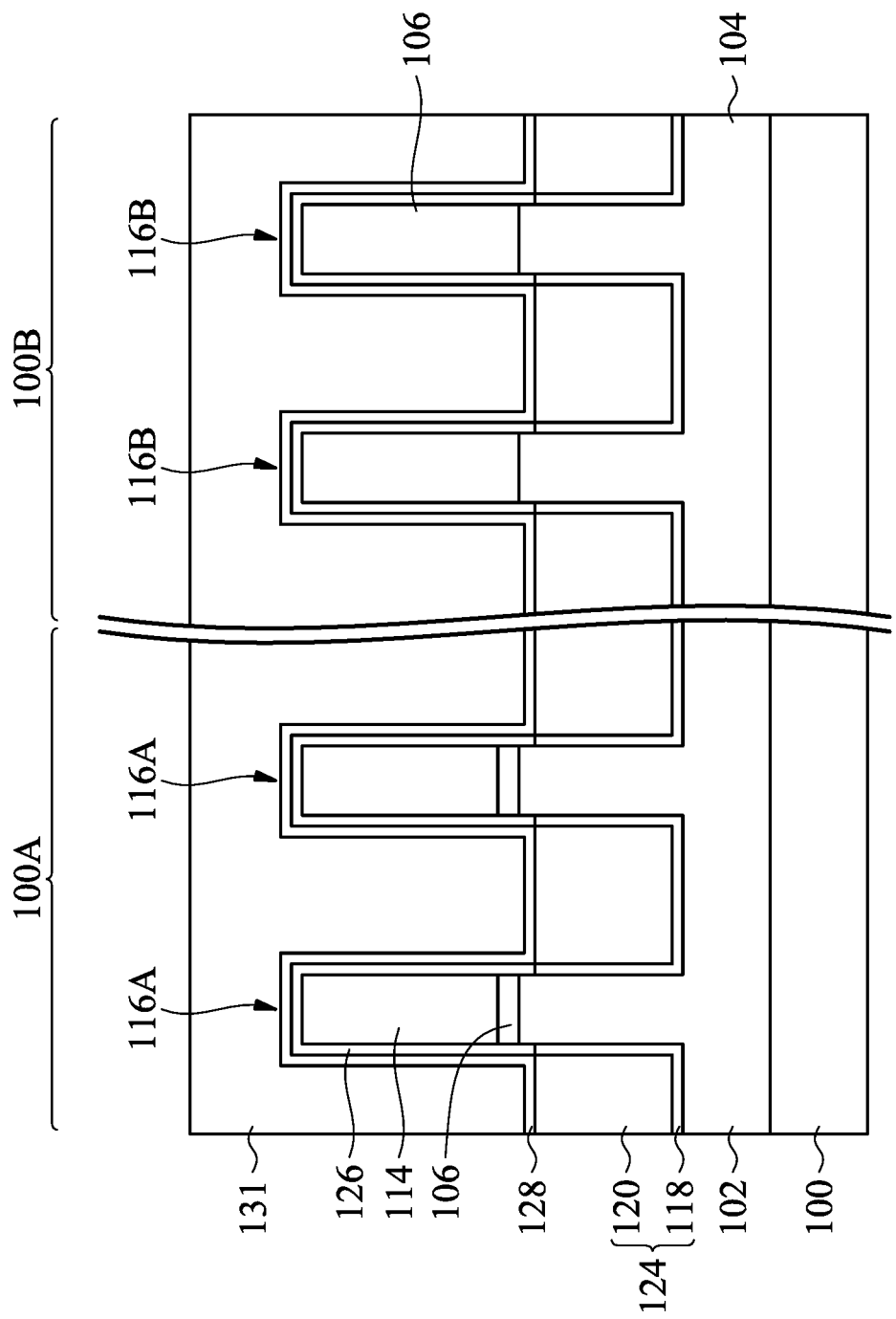
FIGS. 20A and 20B illustrate cross-sectional views of a planarization of the first interlayer dielectric, the masks, the gate seal spacers, and the gate spacers, in accordance with some embodiments.
Figure 20B:
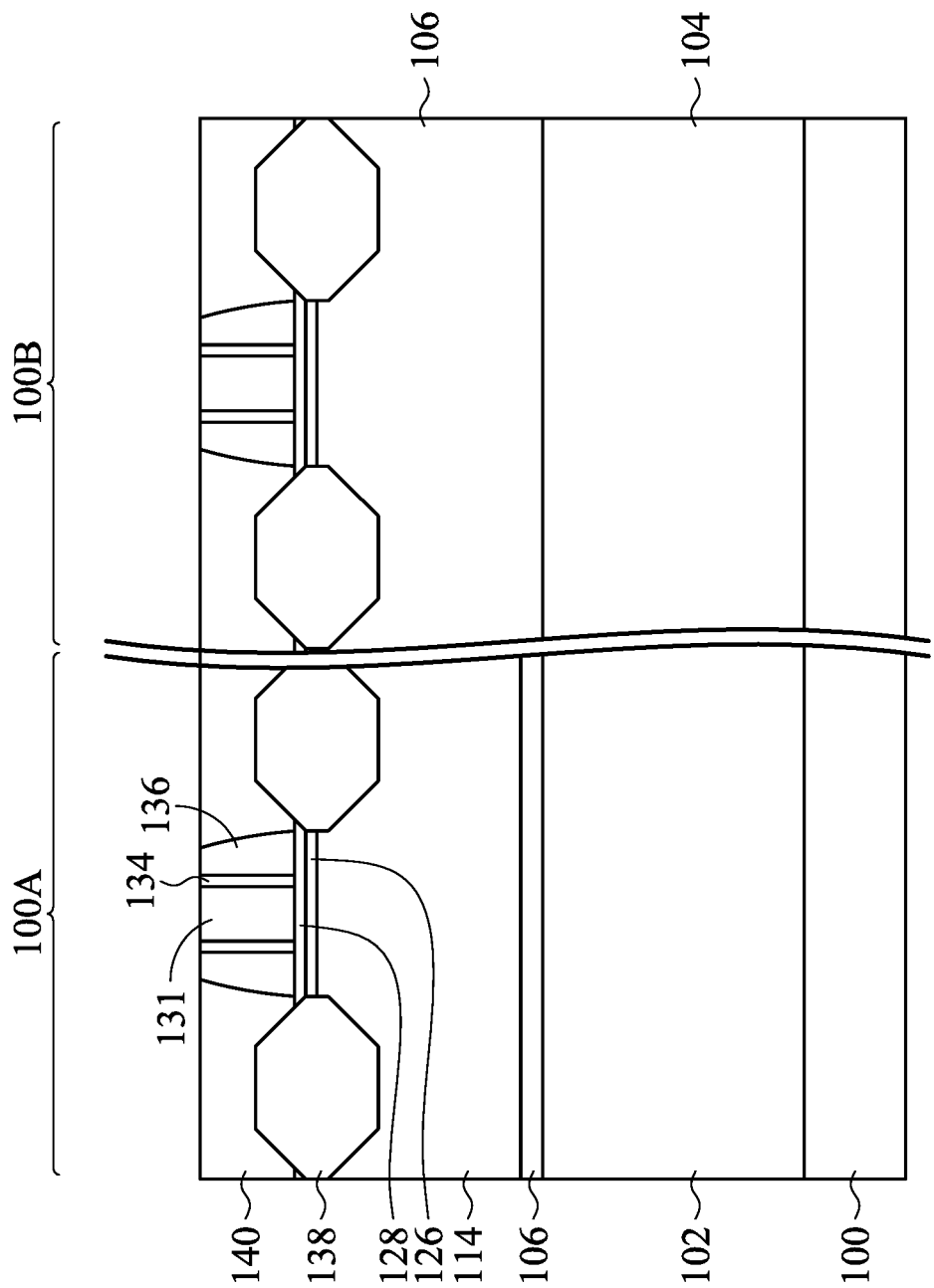

In FIGS. 20A and 20B, a planarization process, such as a CMP, may be performed to level the top surface of the first ILD 140 with the top surfaces of the dummy gates 131. The planarization process may also remove the masks 133 on the dummy gates 131, and portions of the gate seal spacers 134 and the gate spacers 136 along sidewalls of the masks 133. After the planarization process, top surfaces of the dummy gates 131, the gate seal spacers 134, the gate spacers 136, and the first ILD 140 are level. Accordingly, the top surfaces of the dummy gates 131 are exposed through the first ILD 140.

Figure 21A:
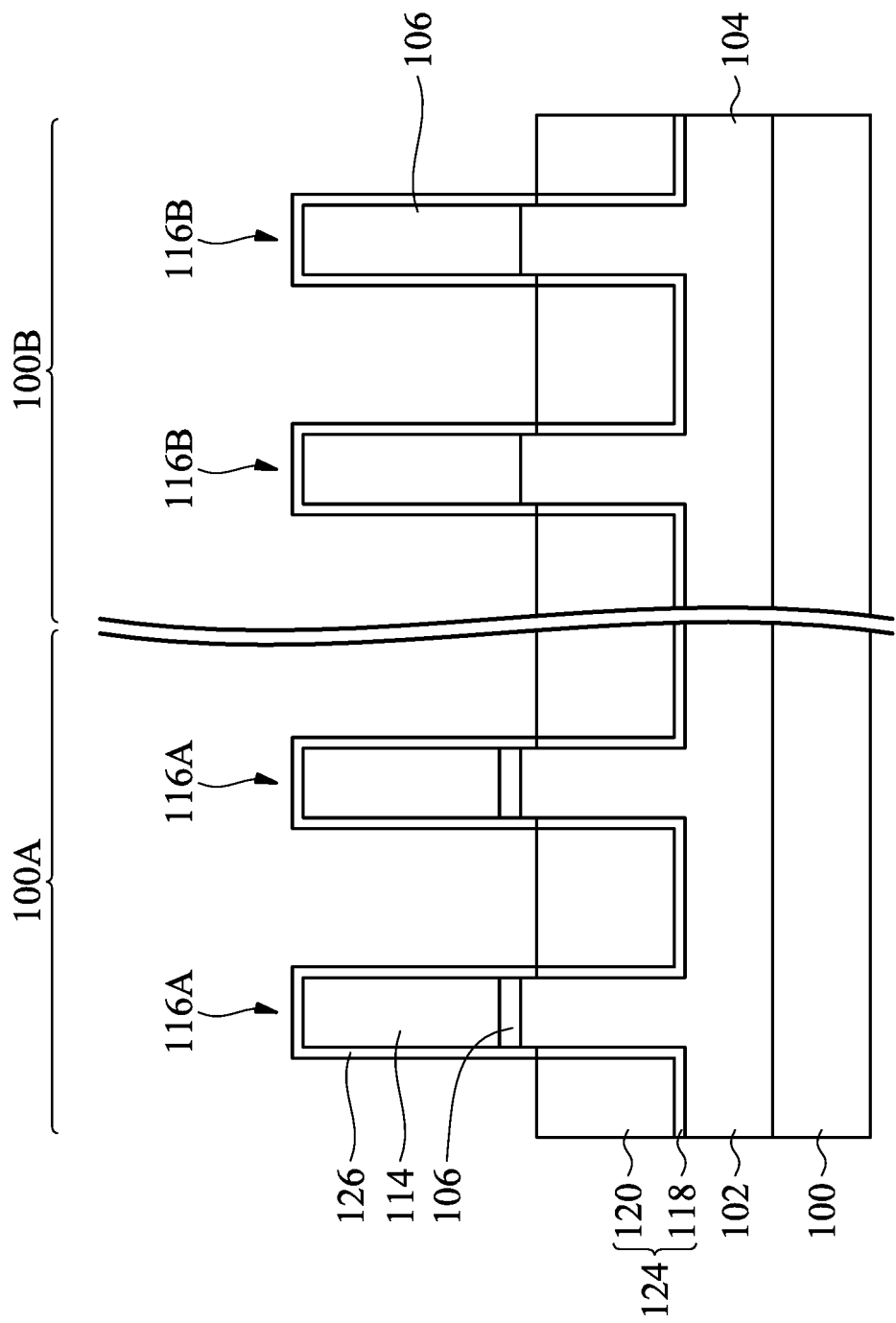
FIGS. 21A and 21B illustrate cross-sectional views of a removal of the dummy gates, in accordance with some embodiments.
Figure 21B:
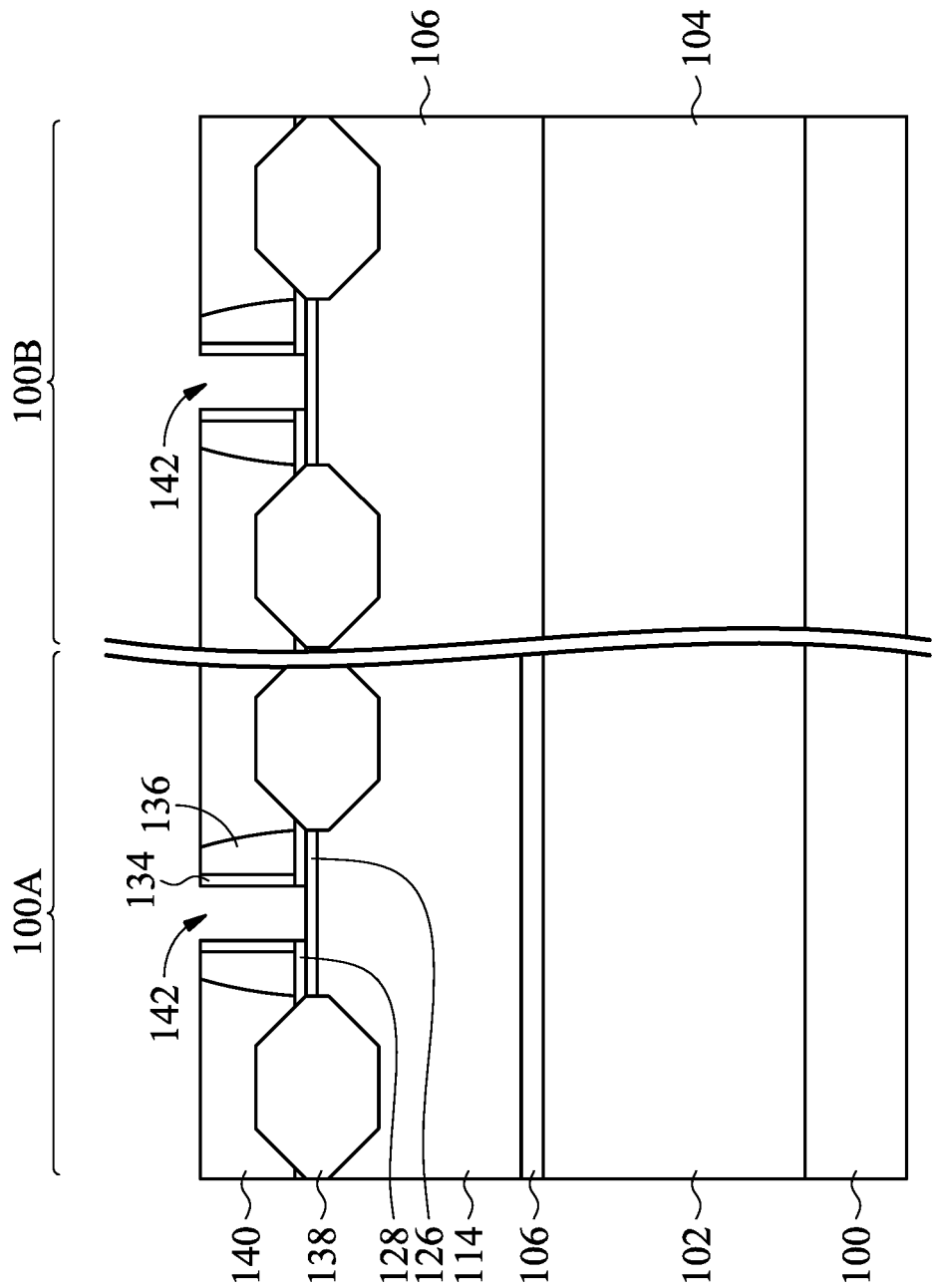

In FIGS. 21A and 21B, the dummy gates 131 and portions of the dummy dielectric layer 128 directly underlying the dummy gates 131 are removed in an etching step(s), so that recesses 142 are formed. In some embodiments, the dummy gates 131 are removed by an anisotropic dry etch process. For example, the etching process may include a dry etch process using reaction gas(es) that selectively etch the dummy gates 131 without etching the first ILD 140 or the gate spacers 136. Each recess 142 exposes a channel region of a respective first semiconductor fin 116A or second semiconductor fin 116B. Each channel region is disposed between neighboring pairs of the epitaxial source/drain regions 138. During the removal, the dummy dielectric layer 128 may be used as an etch stop layer when the dummy gates 131 are etched. The dummy dielectric layer 128 may then be removed after the removal of the dummy gates 131.

Figure 22A:
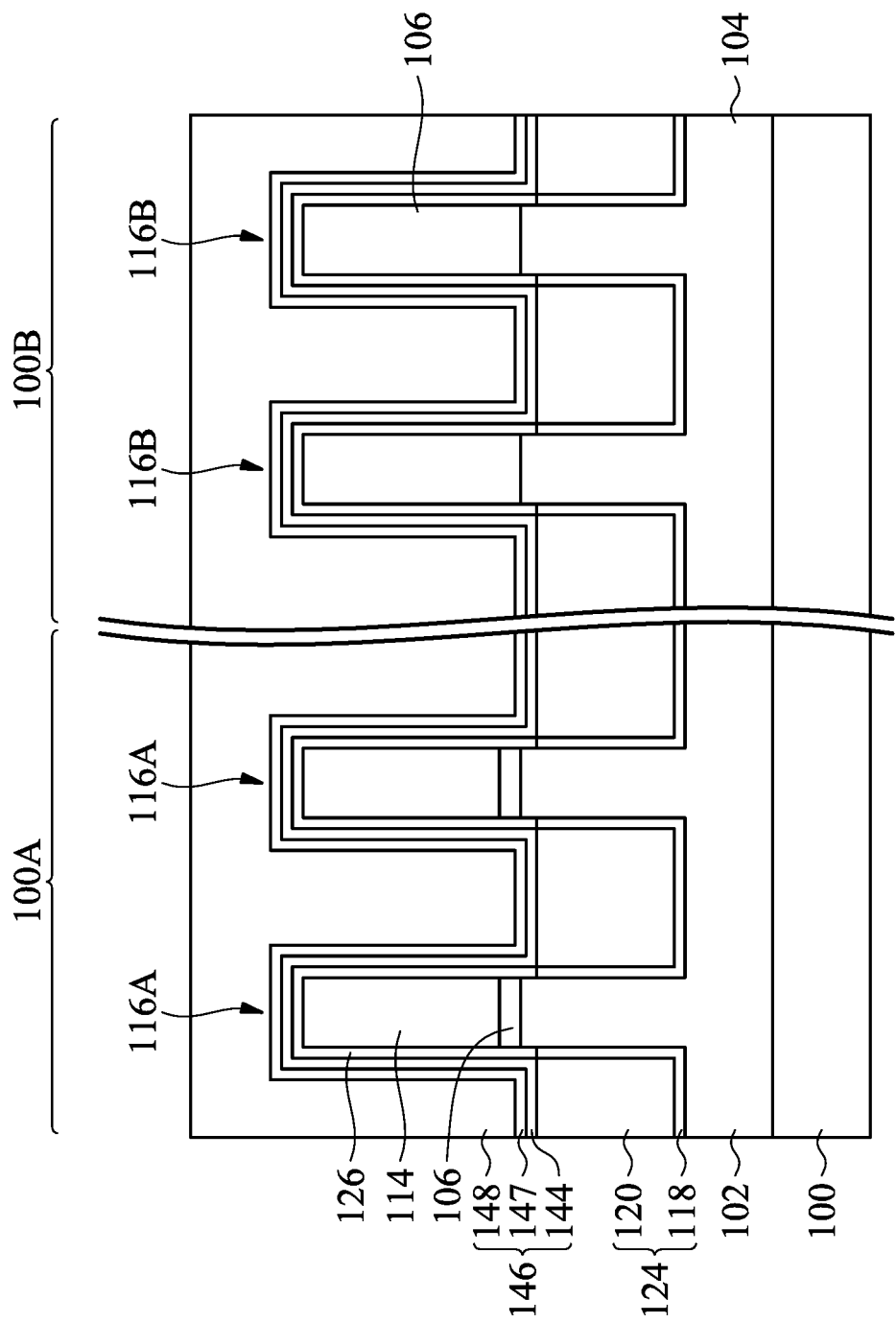
FIGS. 22A and 22B illustrate cross-sectional views of a formation of a gate dielectric layer, a work function layer, and gate electrodes, in accordance with some embodiments.
Figure 22B:
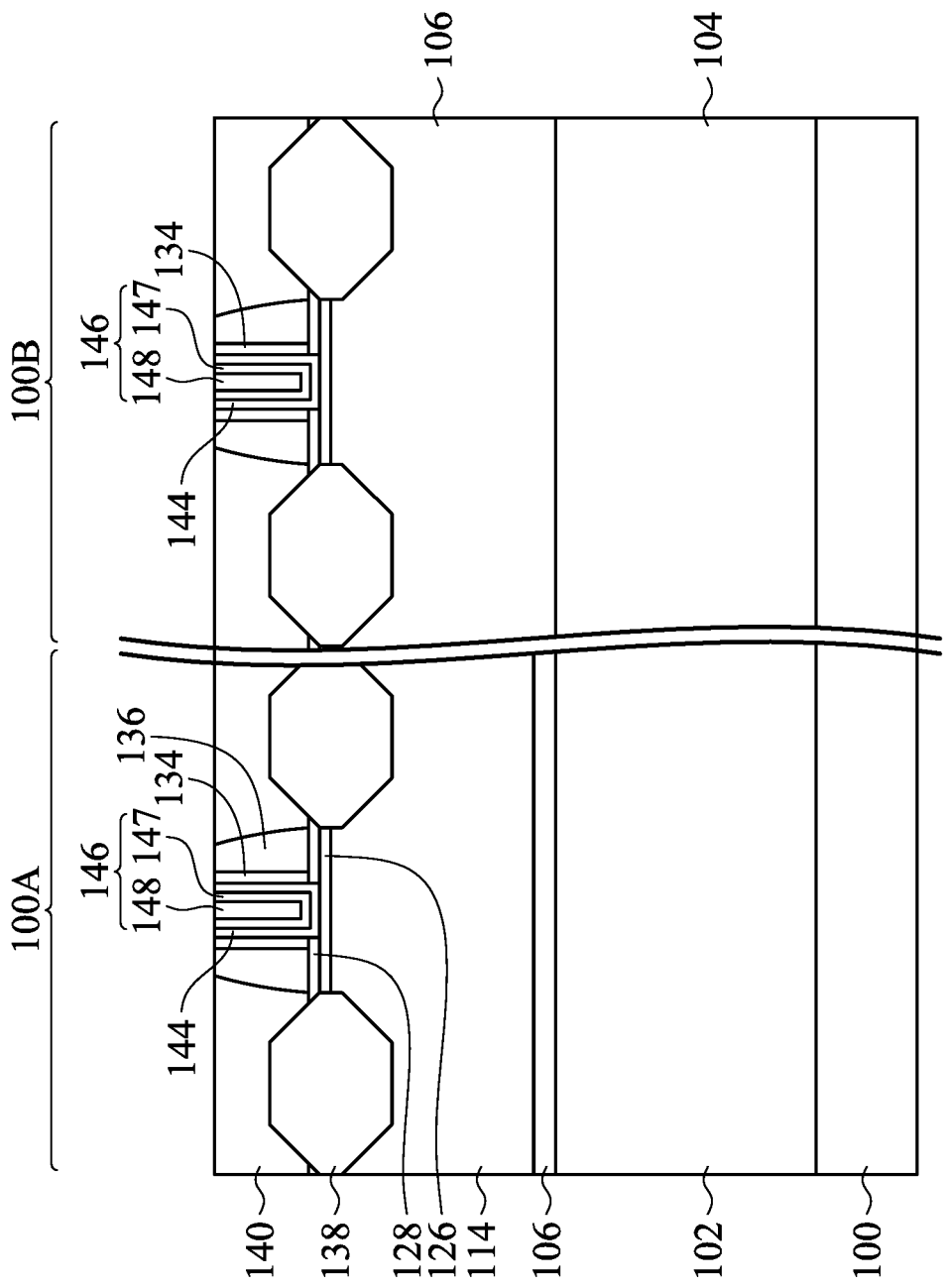

In FIGS. 22A and 22B, gate dielectric layers 144 and gate electrodes 146 are formed for replacement gates. The gate dielectric layers 144 are deposited conformally in the recesses 142, such as on the top surfaces and the sidewalls of the first semiconductor fins 116A and the second semiconductor fins 116B and on sidewalls of the gate seal spacers 134/gate spacers 136. The gate dielectric layers 144 may also be formed on the top surface of the first ILD 140. In accordance with some embodiments, the gate dielectric layers 144 comprise silicon oxide, silicon nitride, or multilayers thereof. In some embodiments, the gate dielectric layers 144 are a high-k dielectric material, and in these embodiments, the gate dielectric layers 144 may have a k value greater than about 7.0, and may include a metal oxide or a silicate of Hf, Al, Zr, La, Mg, Ba, Ti, Pb, and combinations thereof. The formation methods of the gate dielectric layers 144 may include molecular beam deposition (MBD), ALD, PECVD, and the like.

The gate electrodes 146 are deposited over the gate dielectric layers 144 and fill the remaining portions of the recesses 142. The gate electrodes 146 may be a metal-containing material such as TiN, TaN, TaC, Co, Ru, Al, combinations thereof, or multi-layers thereof. The gate electrodes 146 may include one or more layers of conductive material, such as a work function layer 147 and a fill material 148. After the filling of the gate electrodes 146, a planarization process, such as a CMP, may be performed to remove the excess portions of the gate dielectric layers 144 and the gate electrodes 146, which excess portions are over the top surface of the first ILD 140. The remaining portions of the gate electrodes 146 and the gate dielectric layers 144 thus form replacement gates of the resulting FinFETs. The gate electrodes 146 and the gate dielectric layers 144 may be collectively referred to as a "gate" or a "gate stack." The gate and the gate stacks may extend along sidewalls of a channel region of the first semiconductor fins 116A and the second semiconductor fins 116B.

The formation of the gate dielectric layers 144 in the first region 100A and the second region 100B may occur simultaneously such that the gate dielectric layers 144 in each region are formed from the same materials, and the formation of the gate electrodes 146 may occur simultaneously such that the gate electrodes 146 in each region are formed from the same materials. In some embodiments, the gate dielectric layers 144 in each region may be formed by distinct processes, such that the gate dielectric layers 144 may be different materials, and/or the gate electrodes 146 in each region may be formed by distinct processes, such that the gate electrodes 146 may be different materials. Various masking steps may be used to mask and expose appropriate regions when using distinct processes.

Figure 23A:
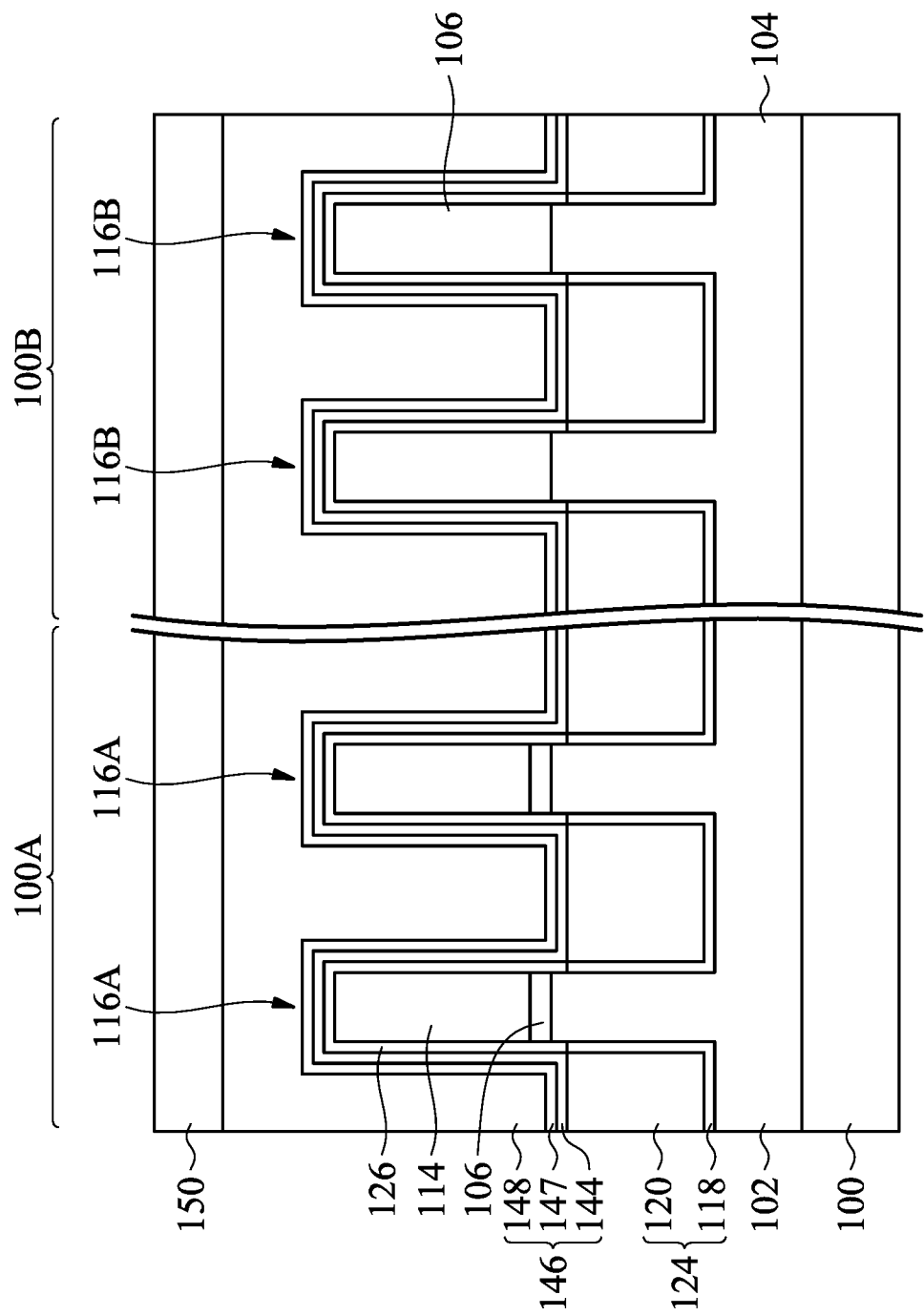
FIGS. 23A and 23B illustrate cross-sectional views of a formation of a second interlayer dielectric, in accordance with some embodiments.
Figure 23B:
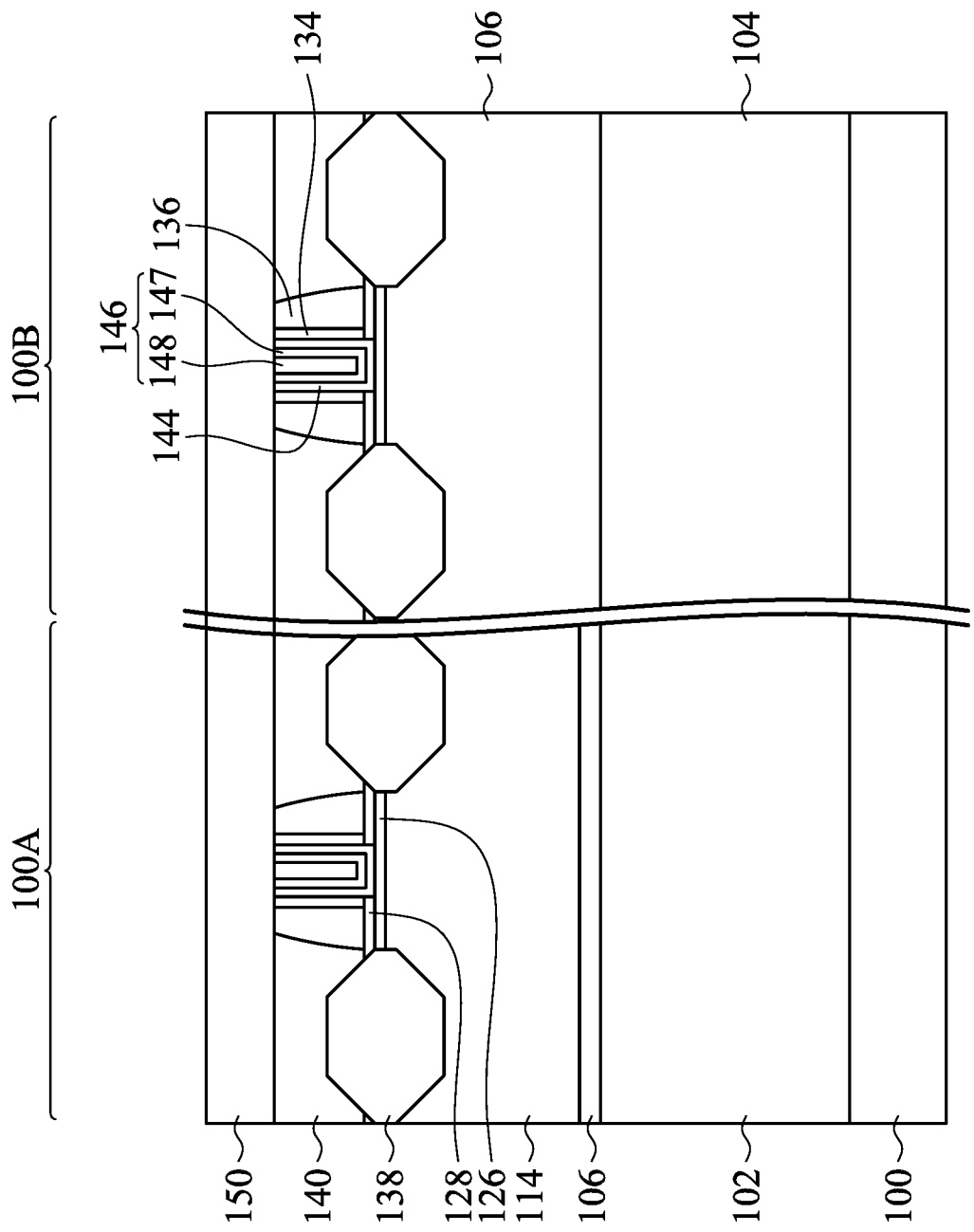

In FIGS. 23A and 23B, a second ILD 150 is deposited over the first ILD 140. In an embodiment, the second ILD 150 is a flowable film formed by a flowable CVD method. In some embodiments, the second ILD 150 is formed of a dielectric material such as PSG, BSG, BPSG, USG, or the like, and may be deposited by any suitable method, such as CVD and PECVD.

Figure 24A:
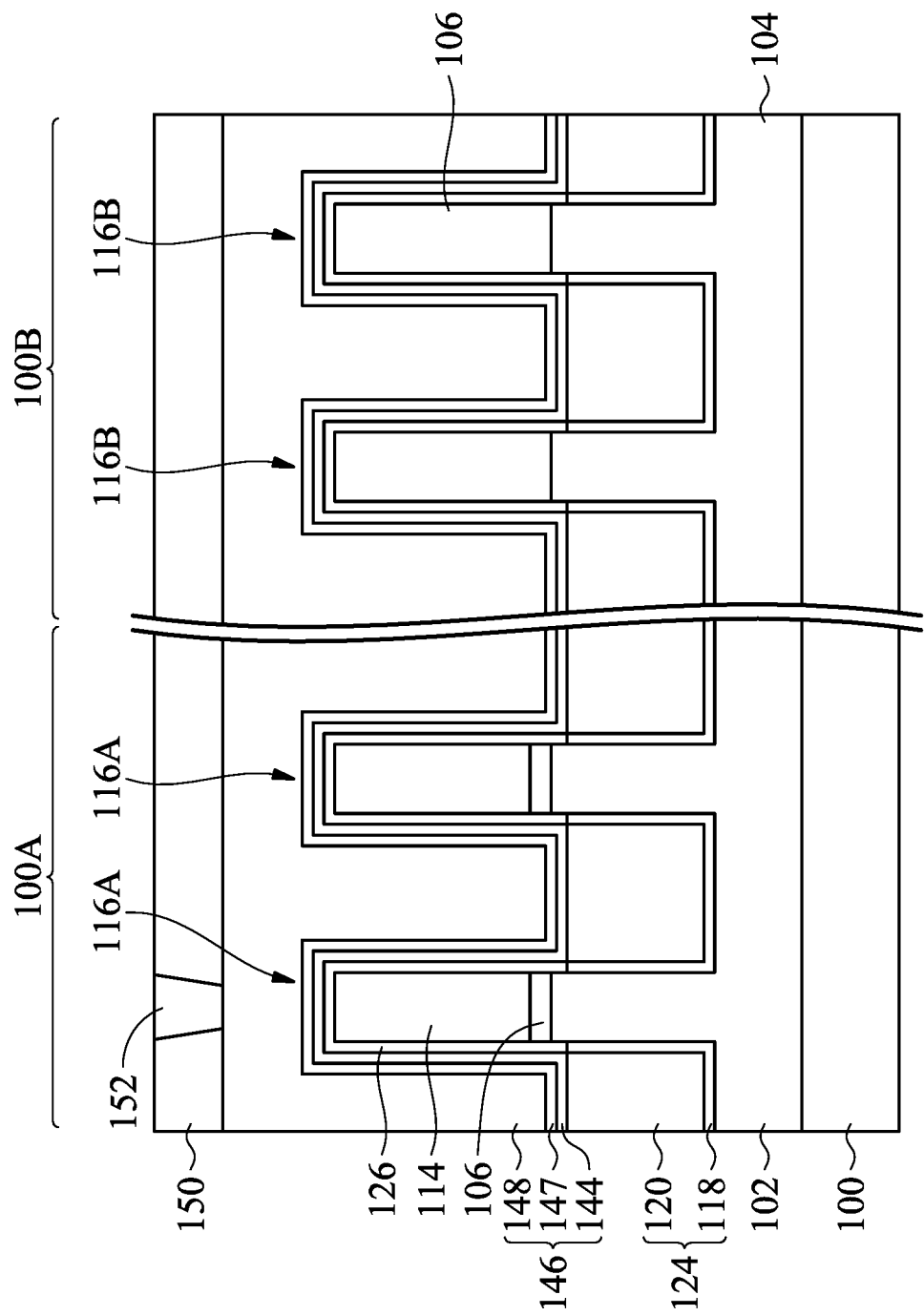
FIGS. 24A and 24B illustrate cross-sectional views of a formation of a gate contact and source/drain contacts, in accordance with some embodiments.
Figure 24B:
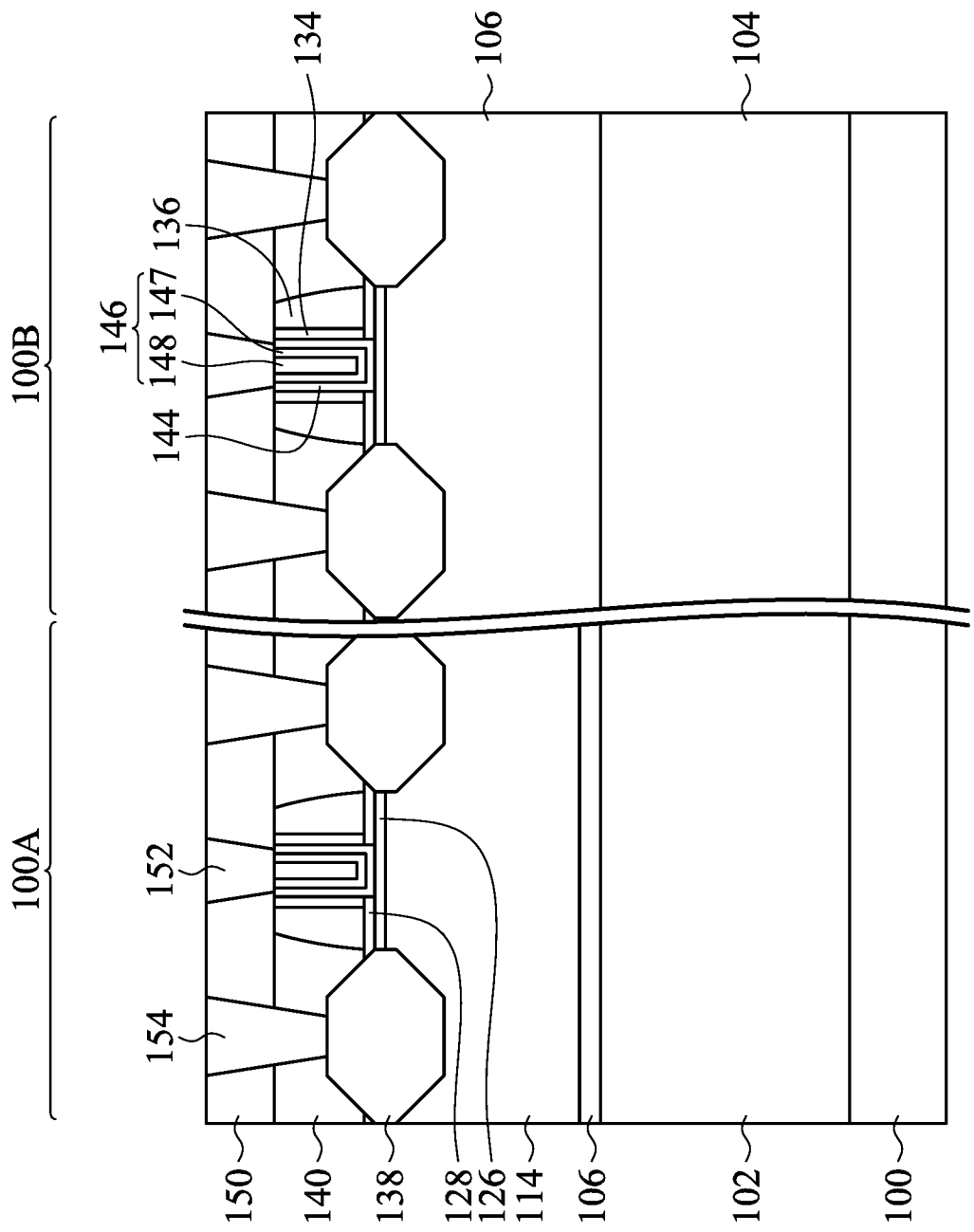

In FIGS. 24A and 24B, a gate contact 152 and source/drain contacts 154 are formed through the second ILD 150 and the first ILD 140. Openings for the source/drain contacts 154 (not separately illustrated) are formed through the second ILD 150 and the first ILD 140, and openings for the gate contact 152 (not separately illustrated) are formed through the second ILD 150. The openings may be formed using acceptable photolithography and etching techniques. Optionally, prior to formation of the gate contact 152 and the source/drain contacts 154, a silicide contact (not separately illustrated) may be formed. The silicide contact may comprise titanium, nickel, cobalt, or erbium, and may be used to reduce the Schottky barrier height of the gate contact 152 and the source/drain contacts 154. However, other metals, such as platinum, palladium, and the like, may also be used. The silicidation may be performed by conformal deposition of an appropriate metal layer, followed by an annealing step which causes the metal to react with the underlying exposed silicon. Un-reacted metal is then removed, such as with a selective etch process.

The gate contact 152 and the source/drain contacts 154 may be formed of conductive materials such as Al, Cu, W, Co, Ti, Ta, Ru, TiN, TiAl, TiAlN, TaN, TaC, NiSi, CoSi, combinations of these, or the like, although any suitable material may be used. The material of the gate contact 152 and the source/drain contacts 154 may be deposited into the openings in the second ILD 150 and the first ILD 140 using a deposition process such as sputtering, chemical vapor deposition, electroplating, electroless plating, or the like, to fill and/or overfill the openings. Once filled or overfilled, any deposited material outside of the openings may be removed using a planarization process such as chemical mechanical polishing (CMP).

The gate contact 152 is physically and electrically connected to the gate electrode 148, and the source/drain contacts 154 are physically and electrically connected to the epitaxial source/drain regions 138. FIGS. 24A and 24B illustrate the gate contact 152 and the source/drain contacts 154 in a same cross-section; however, in other embodiments, the gate contact 152 and the source/drain contacts 154 may be disposed in different cross-sections. Further, the position of the gate contact 152 and the source/drain contacts 154 in FIGS. 24A and 24B are merely illustrative and not intended to be limiting in any way. For example, the gate contact 152 may be vertically aligned with one of the first semiconductor fins 116A as illustrated or may be disposed at a different location on the gate electrode 148. Furthermore, the source/drain contacts 154 may be formed prior to, simultaneously with, or after forming the gate contacts 152.

As discussed above, including the second epitaxial layer 114 of a silicon germanium material in the first semiconductor fins 116A provides a p-type fully strained channel with lower channel resistance, highly efficient mobility, improved Ion/Ioff performance, and improved DIBL. Moreover, forming the cap layer 126 according to the processes described above prevents germanium from out-diffusing from the first semiconductor fins 116A and this, in turn, reduces iso-dense loading effects, reduces the formation of small wings in the first semiconductor fins 116A, reduces the wiggle effect in the first semiconductor fins 116A, and reduces the LER of the first semiconductor fins 116A. As such, semiconductor devices formed according to the above-described methods have improved performance.

In an embodiment, a method includes epitaxially growing a first semiconductor layer over an N-well, the first semiconductor layer including silicon; etching the semiconductor layer to form a first recess; epitaxially growing a second semiconductor layer filling the recess, the second semiconductor layer including silicon germanium; etching the second semiconductor layer, the first semiconductor layer, and the N-well to form a first fin; forming a shallow trench isolation region adjacent the first fin; and forming a cap layer over the first fin, the cap layer contacting the N-well, the first semiconductor layer, and the second semiconductor layer, the cap layer including silicon. In an embodiment, forming the cap layer includes performing a pre-clean process in which a native oxide is removed from exposed surfaces of the N-well, the first semiconductor layer, and the second semiconductor layer. In an embodiment, the pre-clean process is performed in situ using HF or $NH_3$. In an embodiment, forming the cap layer includes a sublimation process, the sublimation process being performed in situ, and the sublimation process forming a first precursor. In an embodiment, the sublimation process is performed at a temperature of between 50° C. and 300° C. In an embodiment, the first precursor includes silane (SiH$_4$), disilane (Si$_2$H$_6$), or dichlorosilane (SiH$_2$Cl$_2$). In an embodiment, forming the cap layer further includes a deposition process in which silicon from the first precursor is deposited over the N-well, the first semiconductor layer, and the second semiconductor layer to form the cap layer, the deposition being performed at a temperature of between 350° C. and 500° C. In an embodiment, an HCl etch, sometimes referred to as an HCl bake, is applied to the cap layer to selectively remove undesirable amorphous Si "wings" over the exposed regions of the liner and the STI regions without substantially etching or removing the desirable crystalline Si cap. The temperature of the furnace is raised to a temperature of between about 550° C. and about 650° C., and the pressure is raised to between about 10 Torr and about 500 Torr. During this bake, a wet etch process with HCl is performed by applying HCl to the cap layer 126 and the amorphous Si "wings" for a time interval of between about 50 seconds to about 100 seconds. Because the etch rate of HCl on amorphous silicon is higher than the etch rate of HCl on crystalline silicon, the amorphous silicon "wings" will be etched away while the cap layer made up of crystalline silicon is minimally effected.

In accordance with another embodiment, a SiGe fin is grown on a Si strip. A crystalline Si cap layer is grown covering the SiGe fin. During the growth of the crystalline Si cap, amorphous Si might grow over an adjacent STI regions and an adjacent liner, resulting in amorphous Si "wings" extending from the Si cap layer. An HCl etch, sometimes referred to as an HCl bake, is performed. The HCl etch removes the undesirable amorphous Si "wings" without substantially etching or removing the desirable crystalline Si cap. In additional embodiments, the etch back process could be a process that provides the same or nearly the same levels of etching and etch selectivity, such as an HBr etch, a controlled Cl etch or the like. In an embodiment, the process can include the following steps: (Step 1) Perform a pre-clean for the SiGe FIN surface. (Step 2) Deposit a Si cap at a temperature of about 400° C. to about 470° C., and under Hydrogen ambient to prevent Ge segregation. (Step 3) Ramp up process temperature to about 550° C. to about 600° C., and ramp up pressure to about 200 Torr to about 500 Torr, and then introduce HCl for the etching of the amorphous Si "wings". Further processing may include formation of an oxide layer over the fin, in some embodiments. The oxide layer could be an I/O oxide (so-called IOOX) in some embodiments, a gate dielectric, or some other liner or layer. In the case of an IOOX oxide, it may be desirable to remove the oxide from some structures. Because the amorphous silicon "wings" have been removed previously, they do not mask the underlying liner and/or STI material and hence that material may also be etched back during the IOOX removal process—resulting in an increased height for the resulting fin.

In accordance with yet another embodiment, a device comprises a silicon substrate with a semiconductor fin extending from the substrate. A trench may be adjacent to the semiconductor fin. There may be a liner comprising SiN or SiO$_2$ with a width of about 1 to 5 nm on the trench, with a shallow trench isolation (STI) region on top of the liner. The semiconductor fin may comprise an upper portion comprising SiGe and a lower portion comprising silicon. In an embodiment, the upper portion of the semiconductor fin has a height of about 40 to 60 nm and a width of about 5 to 10 nm, and the lower portion of the semiconductor fin has a height of about 5 to 15 nm and a width of about 5 to 10 nm. A bottom surface of the lower portion of the semiconductor fin may be level with a top surface of the liner. A cap layer comprising crystalline silicon may cover a top surface and sidewalls of the upper portion of the semiconductor fin. The cap layer may have a width of about 1 to 10 Å.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a device, comprising:
    providing a substrate comprising silicon having a semiconductor fin protruding from a major surface;
    forming a liner and a shallow trench isolation (STI) region adjacent the semiconductor fin;
    depositing a cap over the semiconductor fin, wherein a resulting cap comprises a layer of crystalline silicon over the semiconductor fin and portions of amorphous silicon over the liner and STI region; and
    performing an HCl etch bake process to remove the portions of amorphous silicon over the liner and the STI region.

2. The method of claim 1, wherein the semiconductor fin comprises SiGe.

3. The method of claim 1, wherein the liner comprises SiN or SiO$_2$.

4. The method of claim 1, wherein depositing a cap over the semiconductor fin takes place at a temperature of about 400° C. to about 470° C. and at a pressure of about 50 torr to about 200 torr.

5. The method of claim 1, wherein depositing a cap over the semiconductor fin is performed for a time interval between about 100 seconds to 200 seconds, wherein the deposition is performed in an ambient comprising hydrogen.

6. The method of claim 1, wherein performing an HCl etch bake process comprises increasing the process temperature to about 550° C. to about 600° C.

7. The method of claim 1, wherein performing an HCl etch bake process comprises increasing the pressure to a range of from about 200 torr to about 500 torr.

8. The method of claim 1, wherein performing an HCl etch bake process comprises applying HCl to the cap in order to etch the portions of amorphous silicon for a time interval between about 50 seconds to 100 seconds.

9. A method of manufacturing a device, comprising:
    forming a liner and a shallow trench isolation (STI) region adjacent an semiconductor fin;
    depositing a cap over the semiconductor fin, wherein a resulting cap comprises a layer of crystalline silicon over the semiconductor fin and portions of amorphous silicon over the liner and STI region;
    performing an HCl etch bake process to remove the portions of amorphous silicon over the liner and the STI region;
    forming an oxide for an input/output device (IOOX) over the semiconductor fin, the liner, and the STI region; and
    removing the IOOX with a dry etch process.

10. The method of claim 9, wherein forming an IOOX over the liner comprises oxidizing a top portion of the liner.

11. The method of claim 10, wherein removing the IOOX also removes the oxidized top portion of the liner.

12. The method of claim 9, further comprising annealing the IOOX.

13. The method of claim 9, wherein the dry etch process comprises HF and $NH_4$.

14. A device, comprising:
   a substrate comprising silicon;
   a semiconductor fin extending from the substrate, comprising:
      an Si strip on the substrate;
      a SiGe fin extending from the Si strip; and
      a cap layer covering the top and sidewalls of the SiGe fin;
   a liner on a trench adjacent the semiconductor fin, a top surface of the liner being below a top surface of the Si strip; and
   a shallow trench isolation (STI) region in the trench on top of the liner.

15. The device of claim 14, wherein the SiGe fin comprises a height of about 40 to 60 nm and a width of about 5 to 10 nm.

16. The device of claim 14, wherein the Si strip comprises a height of about 5 to 15 nm and a width of about 5 to 10 nm.

17. The device of claim 14, wherein the cap layer comprises crystalline silicon.

18. The device of claim 17, wherein the cap layer comprises a thickness of about 1 to 10 Å.

19. The device of claim 14, wherein the liner comprises SiN or $SiO_2$.

20. The device of claim 14, wherein the liner comprises a thickness of about 1 to 5 nm.

* * * * *